United States Patent
Franck et al.

(10) Patent No.: US 8,344,806 B1
(45) Date of Patent: Jan. 1, 2013

(54) POWER AMPLIFIER WITH POWER FEEDBACK

(75) Inventors: Stephen Franck, Felton, CA (US); Baker Scott, San Jose, CA (US); George Maxim, Milpitas, CA (US)

(73) Assignee: Amalfi Semiconductor, Inc., Los Gatos, CA (US)

( * ) Notice: Subject to any disclaimer, the term of this patent is extended or adjusted under 35 U.S.C. 154(b) by 64 days.

(21) Appl. No.: 12/893,643

(22) Filed: Sep. 29, 2010

Related U.S. Application Data

(60) Provisional application No. 61/246,672, filed on Sep. 29, 2009, provisional application No. 61/246,680, filed on Sep. 29, 2009, provisional application No. 61/246,740, filed on Sep. 29, 2009, provisional application No. 61/246,744, filed on Sep. 29, 2009, provisional application No. 61/246,762, filed on Sep. 29, 2009.

(51) Int. Cl.
*H03G 3/30* (2006.01)
(52) U.S. Cl. ........................................ 330/285; 330/297
(58) Field of Classification Search .................. 330/127, 330/129, 285, 289, 296, 297
See application file for complete search history.

(56) References Cited

U.S. PATENT DOCUMENTS

| | | | | |
|---|---|---|---|---|
| 6,430,402 | B1 * | 8/2002 | Agahi-Kesheh | 455/115.3 |
| 6,801,161 | B2 * | 10/2004 | Lehtomaki et al. | 342/377 |
| 6,924,698 | B2 * | 8/2005 | Camnitz et al. | 330/140 |
| 7,250,818 | B2 * | 7/2007 | Ayun et al. | 330/140 |
| 8,099,066 | B1 * | 1/2012 | Shirvani et al. | 455/127.1 |

* cited by examiner

*Primary Examiner* — Khanh V Nguyen
(74) *Attorney, Agent, or Firm* — Paul Davis; Goodwin Procter LLP

(57) ABSTRACT

A power amplifier using a drain (collector) power control loop in which the feedback signal is an estimated output power level computed with a linear summation of the output sensed voltage and current. Both RF and baseband voltage and current sensing are possible, and voltage-mode or current-mode signal processing are feasible. This control loop technique is applicable to any means of drain power control circuits such as: supply regulators, DC-DC converters and others. Voltage error amplifiers can be used in conjunction with voltage feedback network, while current error amplifiers can be used with current feedback networks. Regulator sharing between different bands may be used as an area and cost reduction solution. The linear voltage and current summation driven power control technique can be also applied to the gate (base) power control scheme. Similarly, voltage-mode and current-mode signal processing can be implemented.

16 Claims, 29 Drawing Sheets

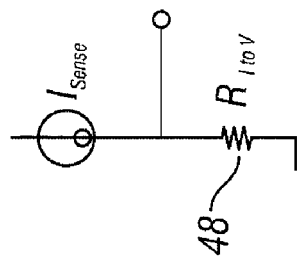
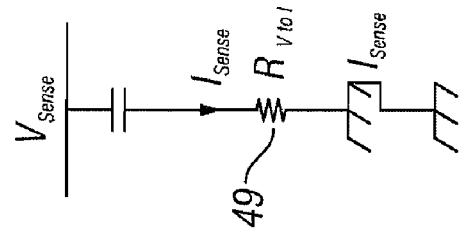
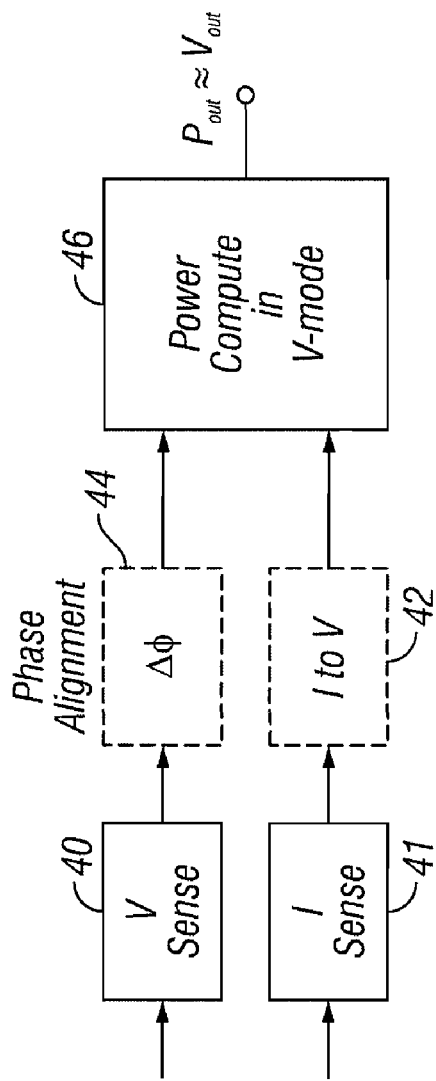
FIG. 4A
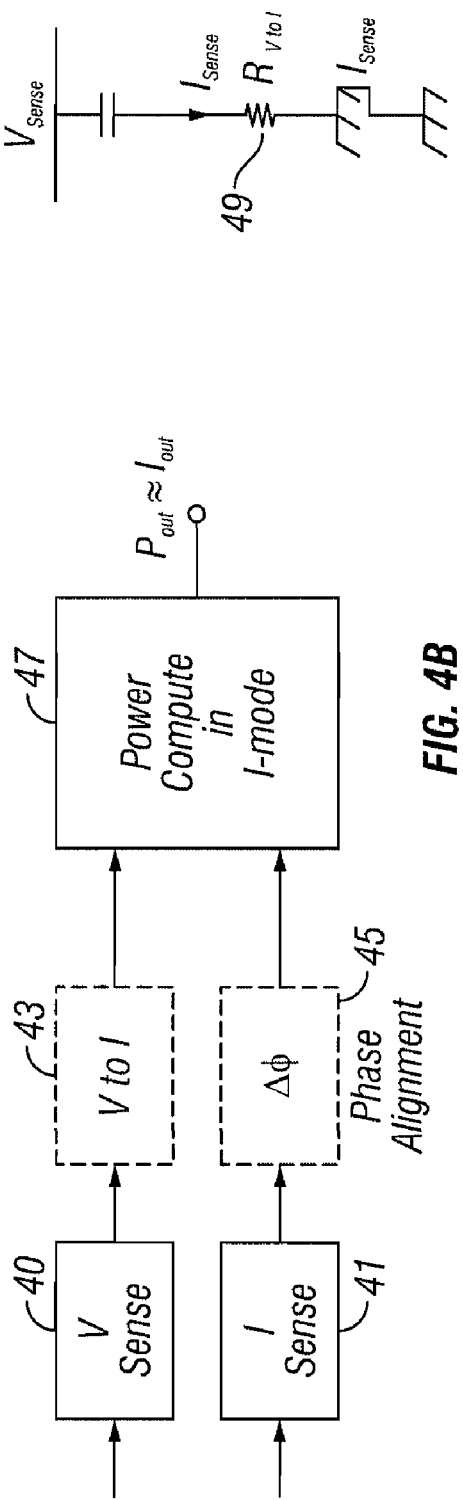
FIG. 4B

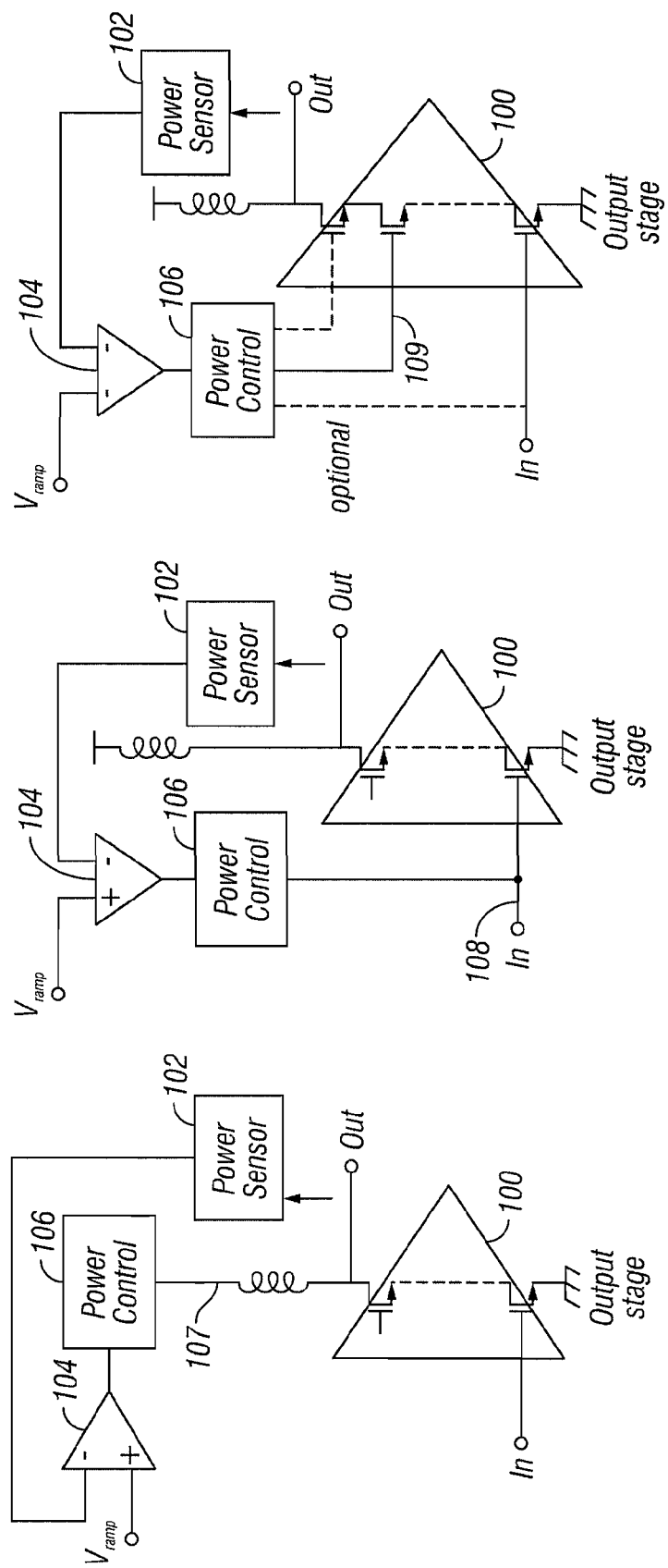

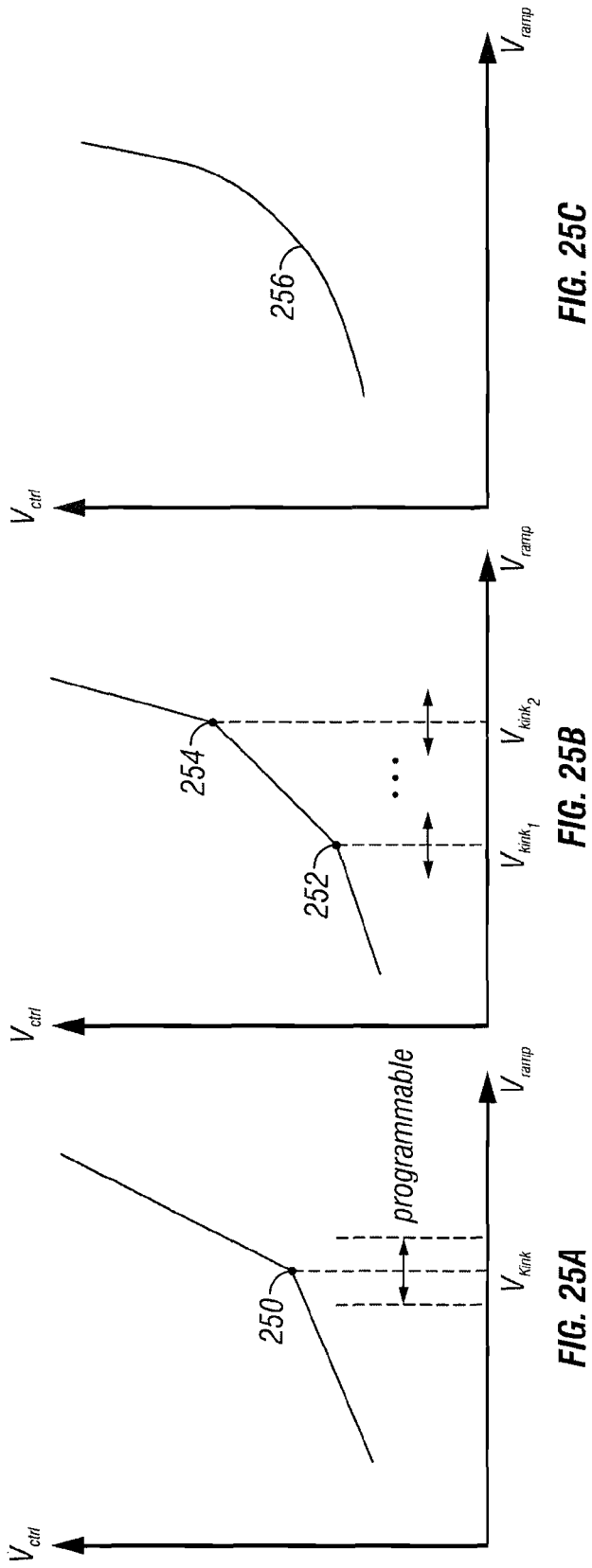

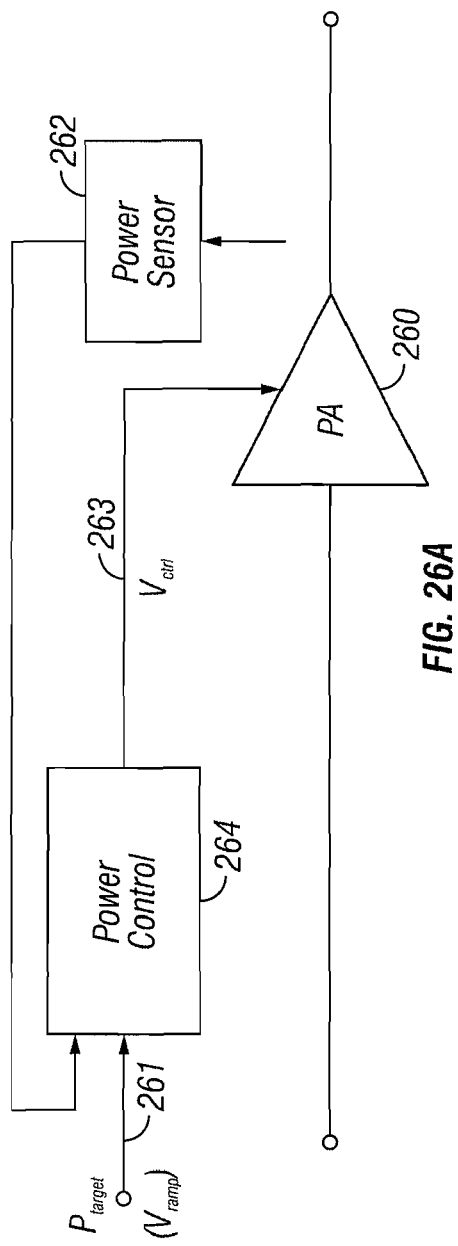
FIG. 26A
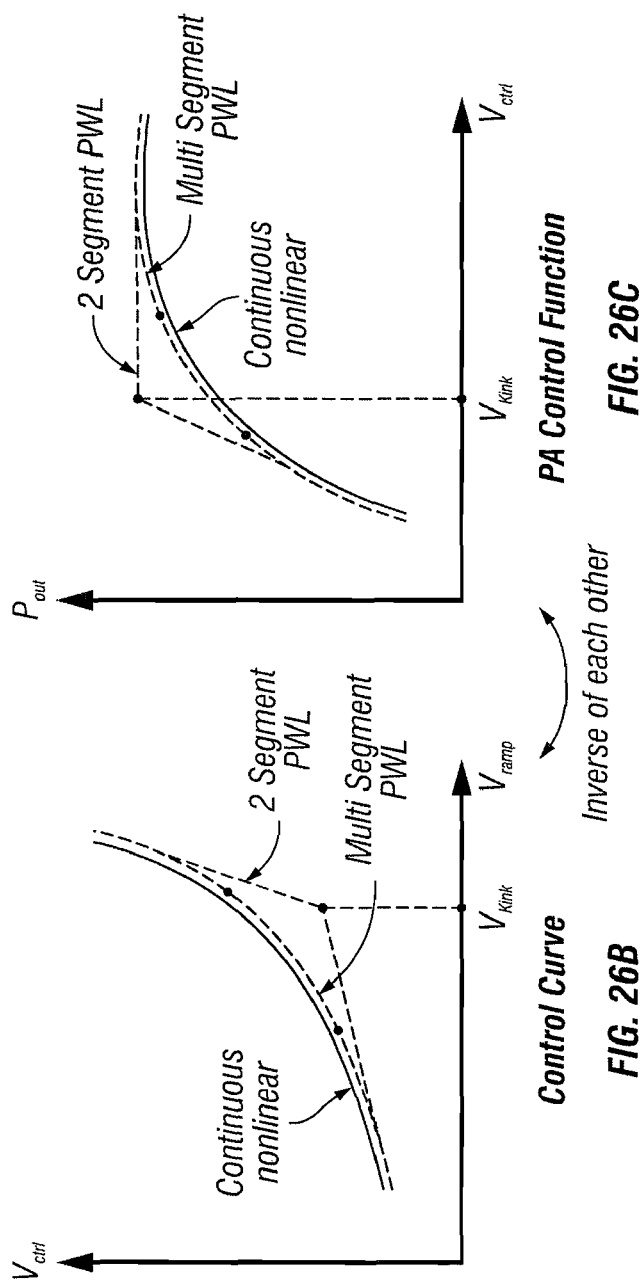
FIG. 26B — Control Curve
FIG. 26C — PA Control Function

POWER AMPLIFIER WITH POWER FEEDBACK

CROSS-REFERENCE TO RELATED APPLICATIONS

This application claims the benefit of U.S. Ser. No. 61/246,672 filed Sep. 29, 2009 and is related to U.S. Ser. No. 61/246,680, U.S. Ser. No. 61/246,740, U.S. Ser. No. 61/246,744, and U.S. Ser. No. 61/246,762, all filed on Sep. 29, 2009. All of the above-identified applications are fully incorporated herein by reference.

BACKGROUND

1. Field of the Invention

The present invention is directed to power amplifiers, and more particularly to power amplifiers that provide for local power feedback.

2. Background

Saturated RF power amplifiers can use two methods of internal power control: the voltage control approach and the current control approach. The voltage control approach sets the supply voltage at the output of the amplifier and uses that to control the output power. The advantage is that the amplifier chain and output stage remains in saturation. These designs are relatively inexpensive and can provide adequate amplification levels. However, they do have some disadvantages. Power delivered to the load depends on the load impedance and increases proportional to uncontrolled current.

Current controlled saturated RF power amplifiers are also used. In this case a regulated current into the load provides equivalent control under a nominal load. In this case, the power varies with voltage of the load, uncontrolled in a current controlled system.

A current controlled amplifier with an extra parallel load matched to the nominal load impedance would provide power control, but with serious waste of power in the parallel resistor.

A voltage controlled amplifier with a series resistor equal to the nominal load would be equivalent at small signal, but could never achieve low drop out voltage at the load end of the resistor.

Power amplifiers described above fail to provide for local power feedback, fail to have improved power control under varying loads, or are capable of maintaining an LDO low dropout during changes in the output impedance seen by the power amplifier.

SUMMARY

Accordingly, an object of the present invention is to provide power amplifiers with local power feedback.

Another object of the present invention is to provide power amplifiers that have improved power control under varying loads A further object of the present invention is to provide power amplifiers that during an output impedance variation are able to maintain a LDO low dropout.

Yet another object of the present invention is to provide output power control for a power amplifier using a simple, yet robust architecture that does not need complicated calibration techniques for process, temperature, supply, corner variations and the like.

Another object of the present invention is to provide a simple but accurate power amplifier output power estimation circuit which avoids the need for multiplication blocks by using a summation of the sensed output voltage and current.

A further object of the present invention is to provide a general power control scheme that applies to both drain and gate power control techniques, or any combination of the two, and which lends itself to both voltage and current mode signal processing.

Another object of the present invention is to provide power amplifiers that use both RF and baseband voltage and current sensing techniques.

Yet another object of the present invention is to provide power amplifiers that implement gain, offset and control curve shape adjustability to a power amplifier power control loop which will provide flexibility in power amplifier performance optimization process.

Another object of the present invention is to provide power amplifier power control schemes that use multiple feedback paths, or a hybrid feedback and feed-forward signal flow.

Yet another object of the present invention is to provide area and power saving in multiband and multi-mode power amplifier applications by sharing the power control block between the different bands or modes.

A further object of the present invention is to provide different feedback network architectures for the baseband and RF voltage and current sensing using voltage-mode or current-mode signal processing for power amplifiers.

Yet another object of the present is to provide control to more than one node in a power amplifier signal path in order to improve efficiency at backed-off output power level.

Another object of the present invention is to provide a more general embodiment of the output power estimator using a high order voltage and current summation relationship.

These and other objects of the present invention are achieved in, a power amplifier system that has an error amplifier with an input voltage or current, an output voltage or current, and a voltage or current feedback network. A regulated power supply is provided for a load and coupled to the error amplifier. A voltage or current feedback is coupled to the error amplifier and a current feedback is coupled to the feedback network. A programmable linear or higher order summation of current and voltage feedback provides a programmable constant power region.

DRAWINGS

FIG. 1(a) is a schematic diagram illustrating linear weight summation approximation of a power amplifier output power in one embodiment of the present invention.

FIG. 1(b) corresponds to FIG. 1(a) and shows the transfer characteristics.

FIG. 2 is a schematic diagram of a power amplifier control scheme of the present invention using voltage and current combining.

FIGS. 3(a) and (b) illustrate higher order power estimation based on sensed voltage and current in one embodiment of the present invention.

FIGS. 4(a) and (b) illustrate voltage and current sensing signal processing in one embodiment of the present invention.

Figure 7B:
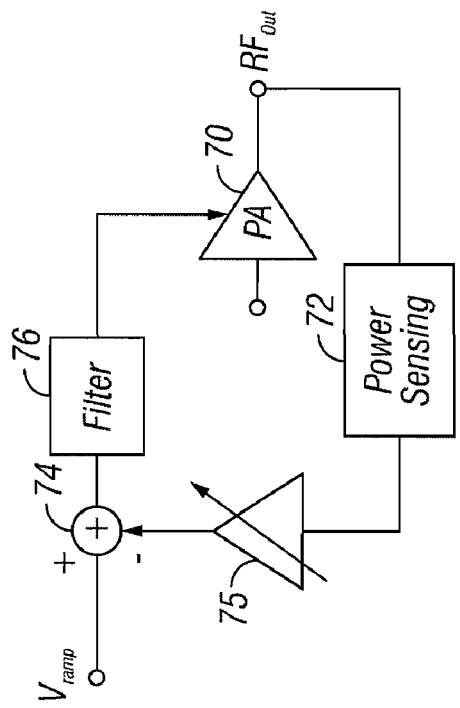
Figure 7A:
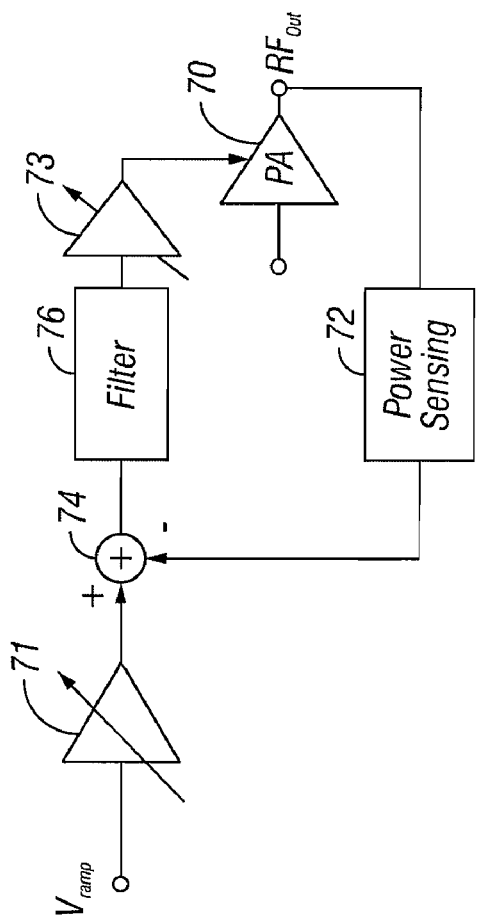

FIGS. 7(a) and (b) are schematic diagrams illustrating power control gain/effect adjustments with forward gain change, and feedback gain change in one embodiment of the present invention.

Figure 8B:
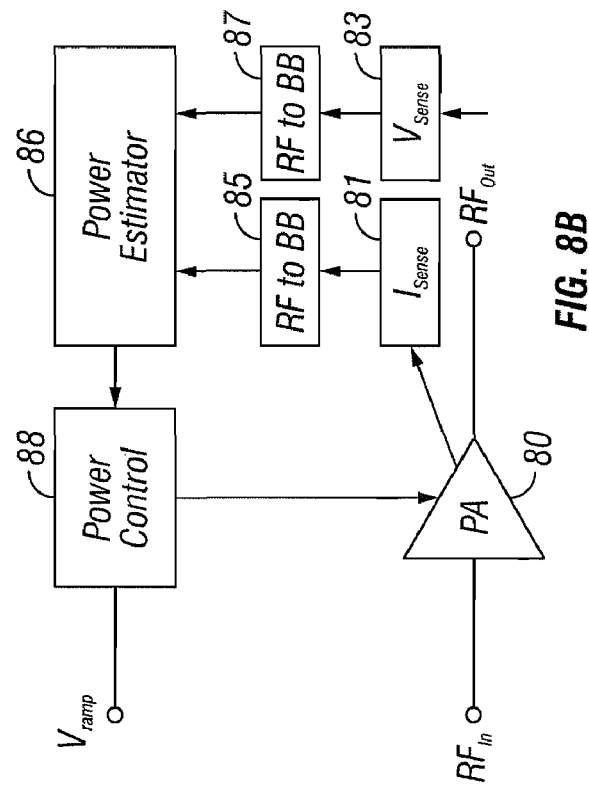
Figure 8A:
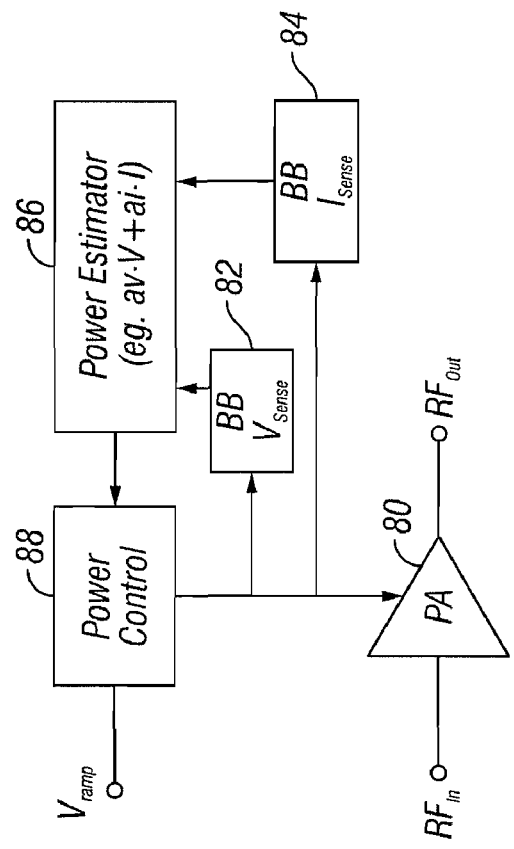

FIGS. 8(a) and (b) are schematic diagrams of power control using baseband and RF sensors in one embodiment of the present invention.

Figures 9A, 9B:
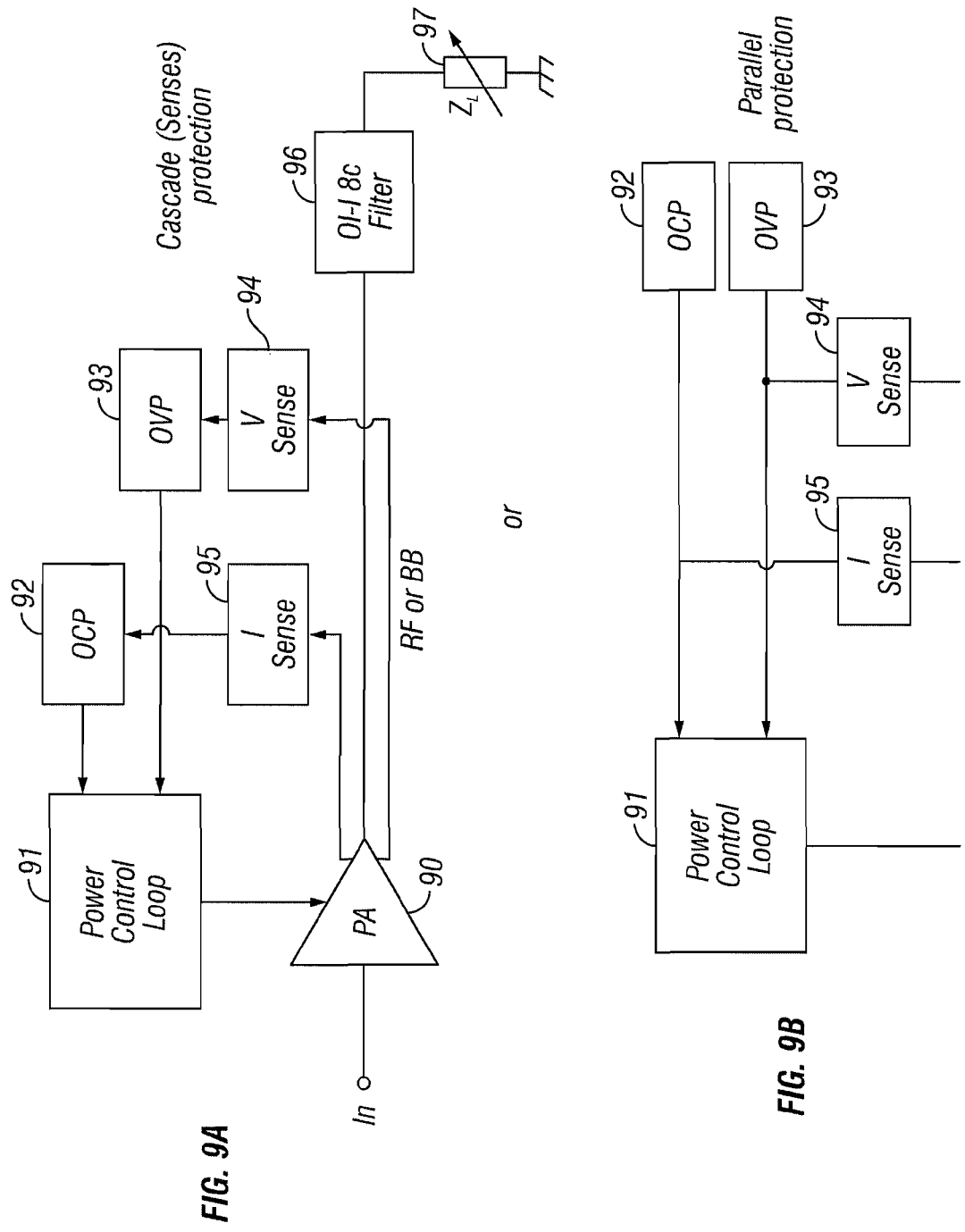

FIGS. 9(a) and (b) are schematic diagrams of power control loops for power amplifiers with over-voltage and over current protection in one embodiment of the present invention.

FIGS. 10(a) through (c) are schematic diagrams illustrating methods of power control at the output stage with drain control, main gate control and cascode gate control in one embodiment of the present invention.

Figures 11A, 11B, 11C:
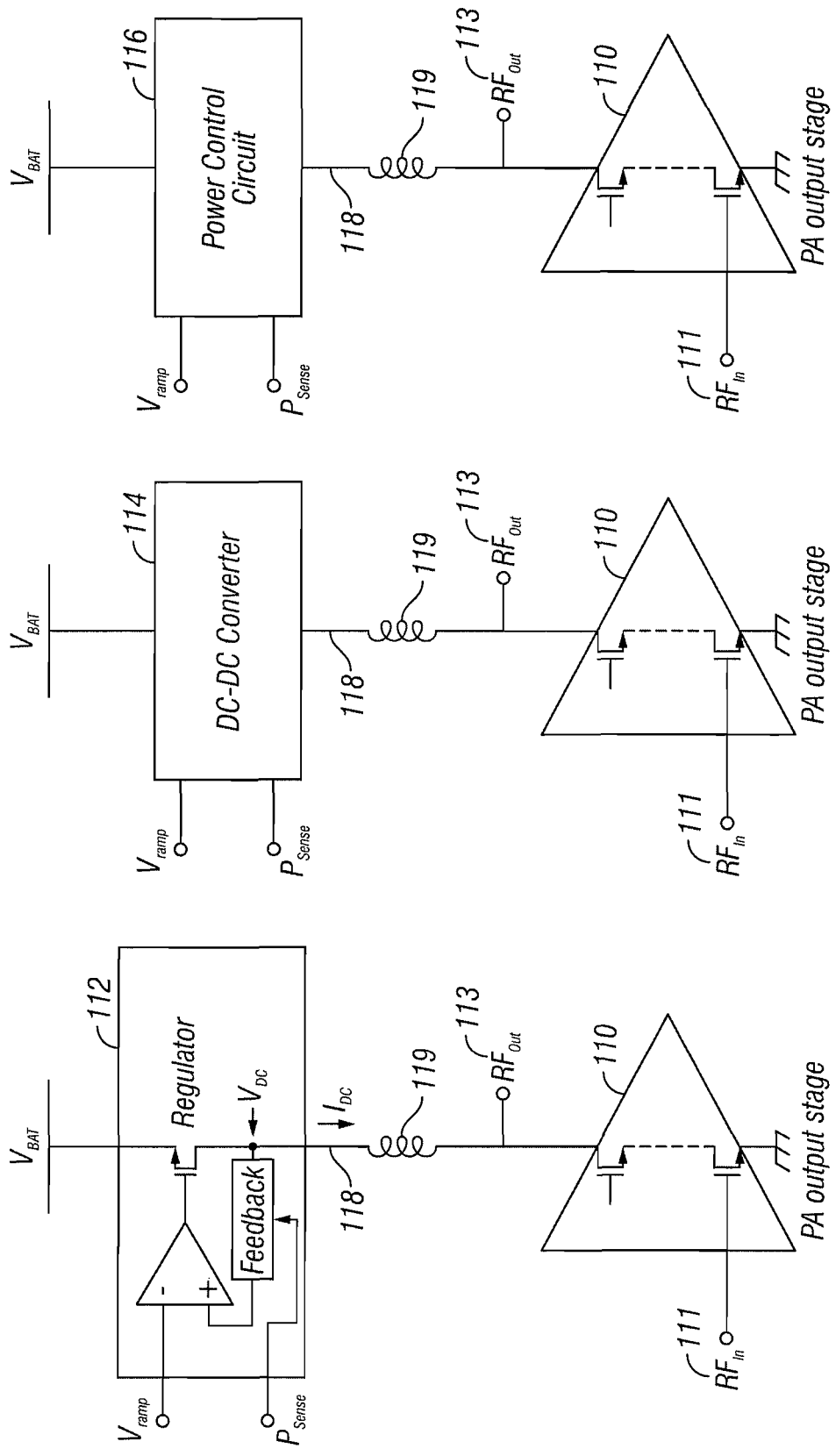

FIGS. 11(a) through (c) are schematic diagrams illustrating drain power control using a regular, a DC-DC converter and other power control circuits in one embodiment of the present invention.

Figure 12:
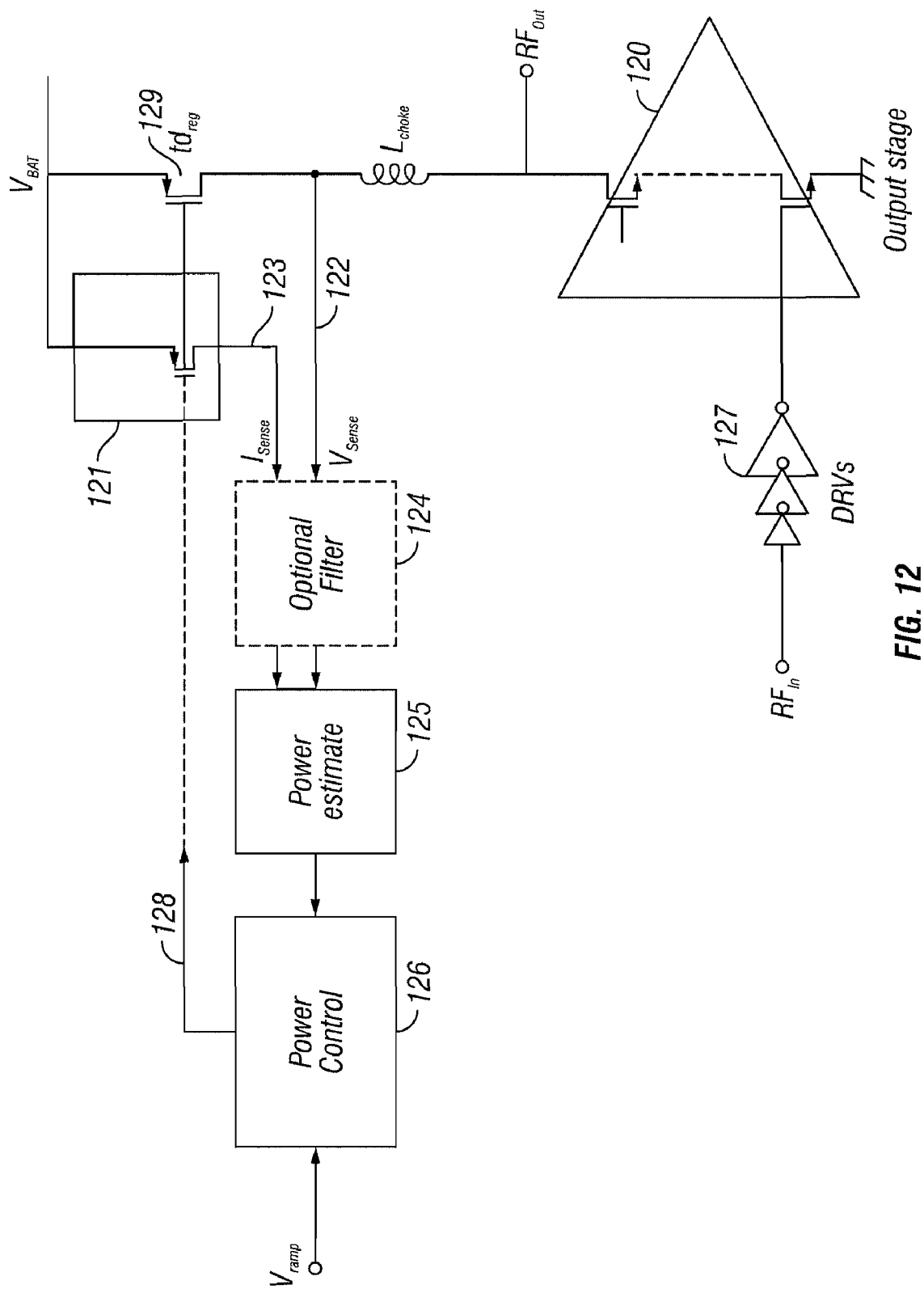

FIG. 12 is a schematic diagram illustrating a power amplifier with drain power control with baseband voltage and current sensing in one embodiment of the present invention.

Figure 13:
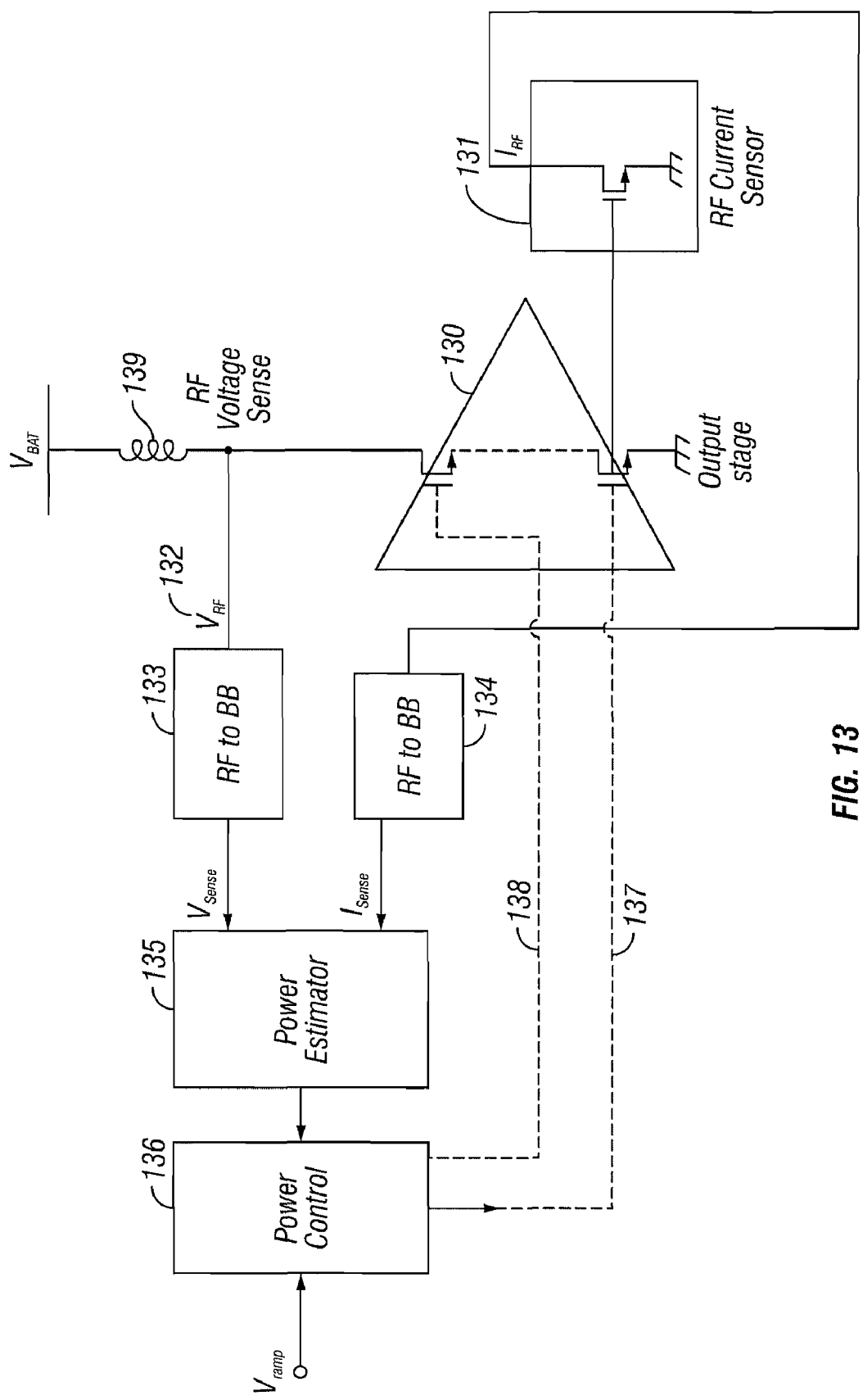

FIG. 13 is a schematic diagram illustrating a power amplifier with gate power control, RF voltage and current sensing in one embodiment of the present invention.

Figure 14:
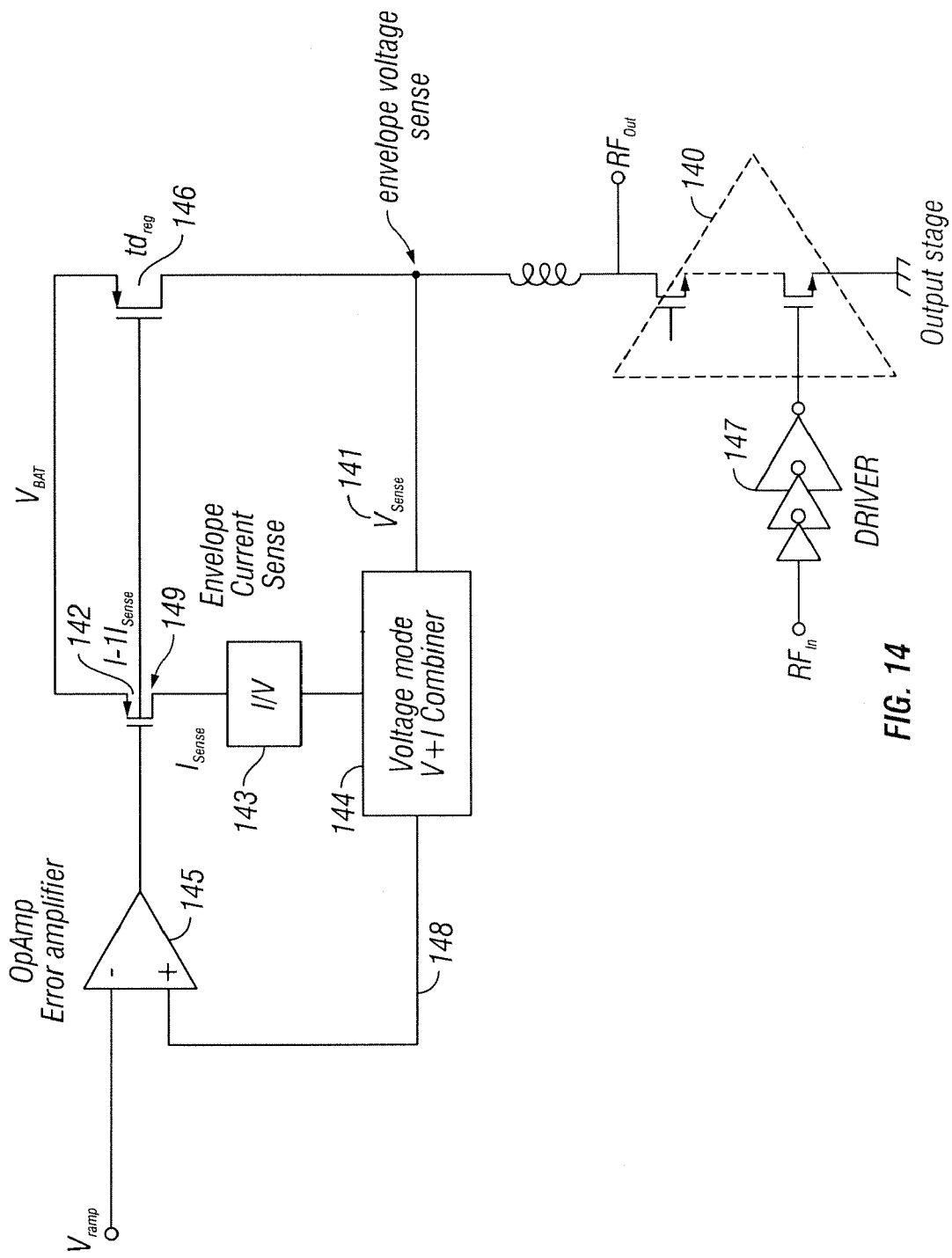

FIG. 14 is a schematic diagram illustrating a V+I drain power amplifier power control loop using envelope signals and voltage mode signal processing in one embodiment of the present invention.

Figure 15:
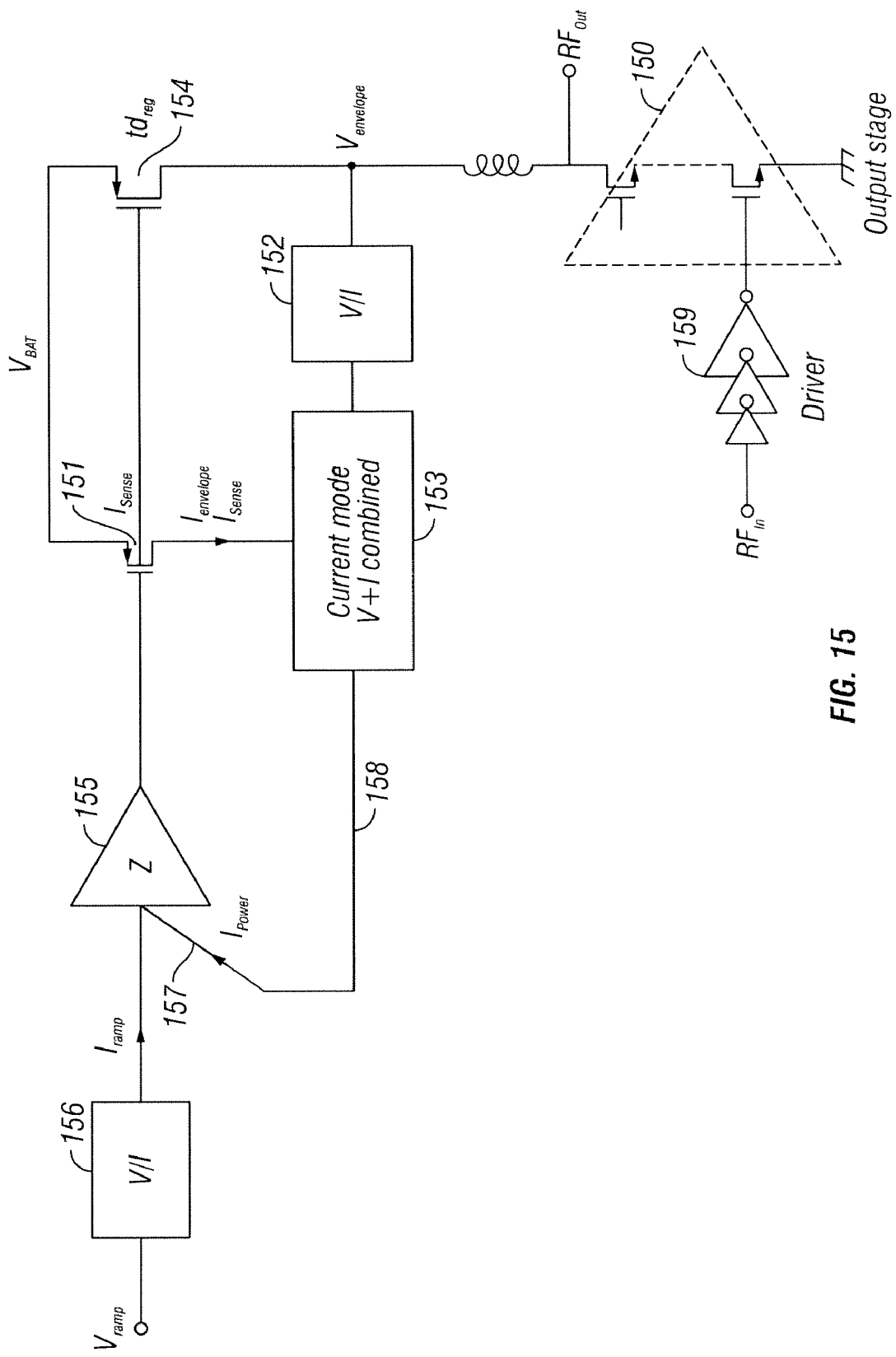

FIG. 15 is a schematic diagram illustrating current mode signal processing V+I with a driver power control loop using baseband sensing in one embodiment of the present invention.

Figures 16A, 16B:
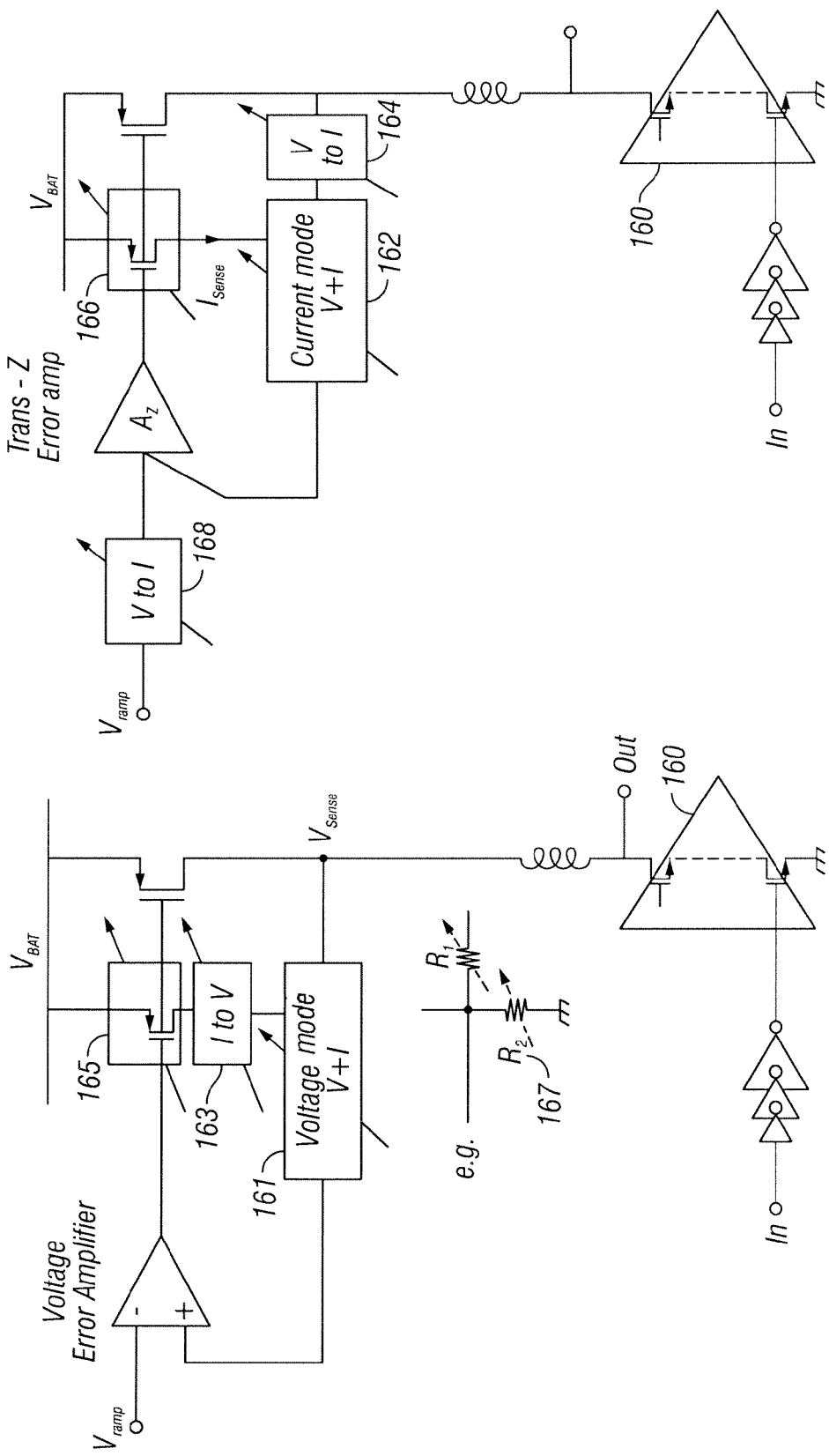

FIG. 16 is a schematic diagram of voltage mode and current mode power control for a power amplifier using voltage and current power estimation in one embodiment of the present invention.

Figure 17:
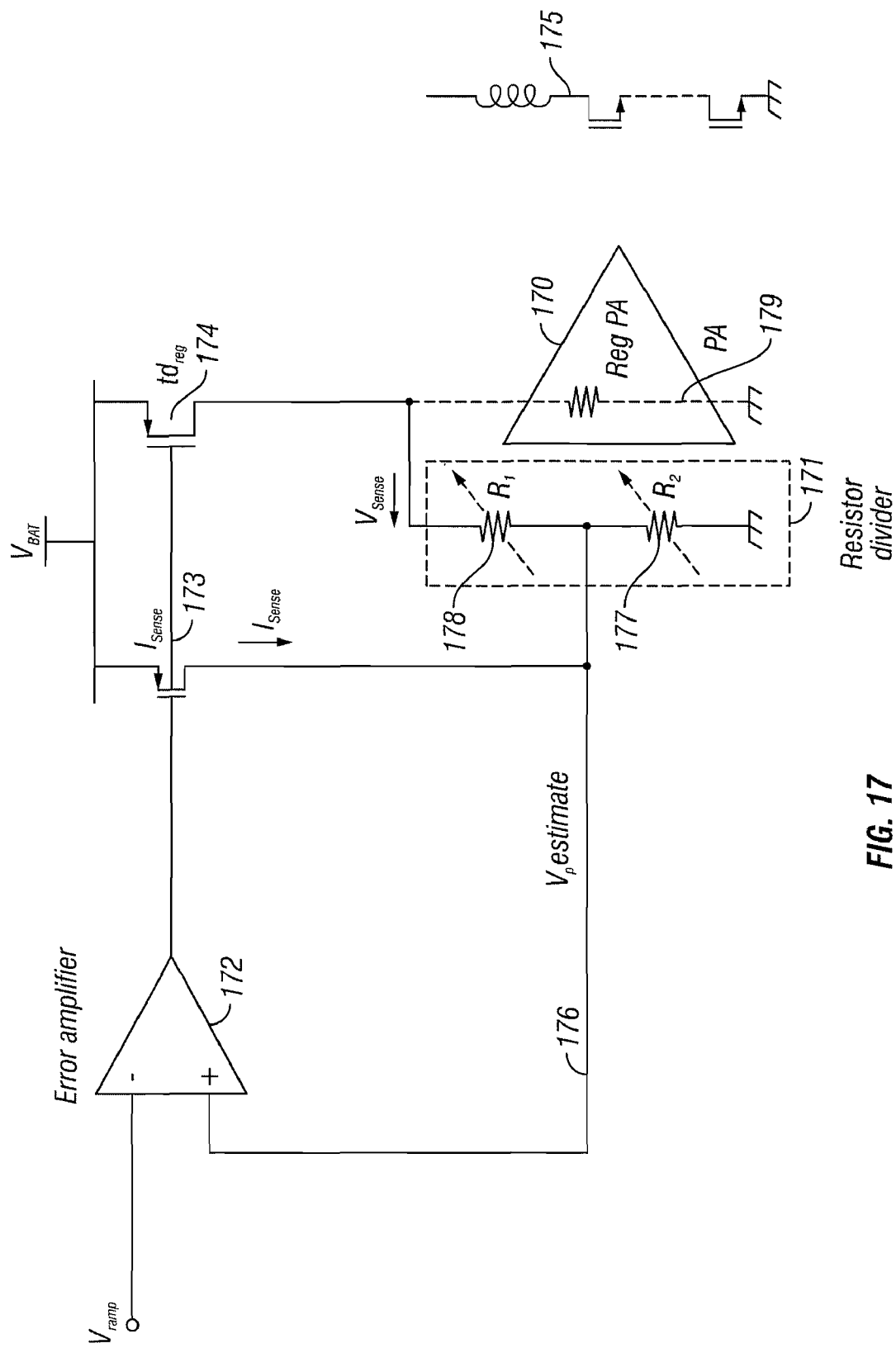

FIG. 17 is a schematic diagram of voltage mode signal processing using resistor divider to sense the output voltage of a power amplifier in one embodiment of the present invention.

Figure 18:
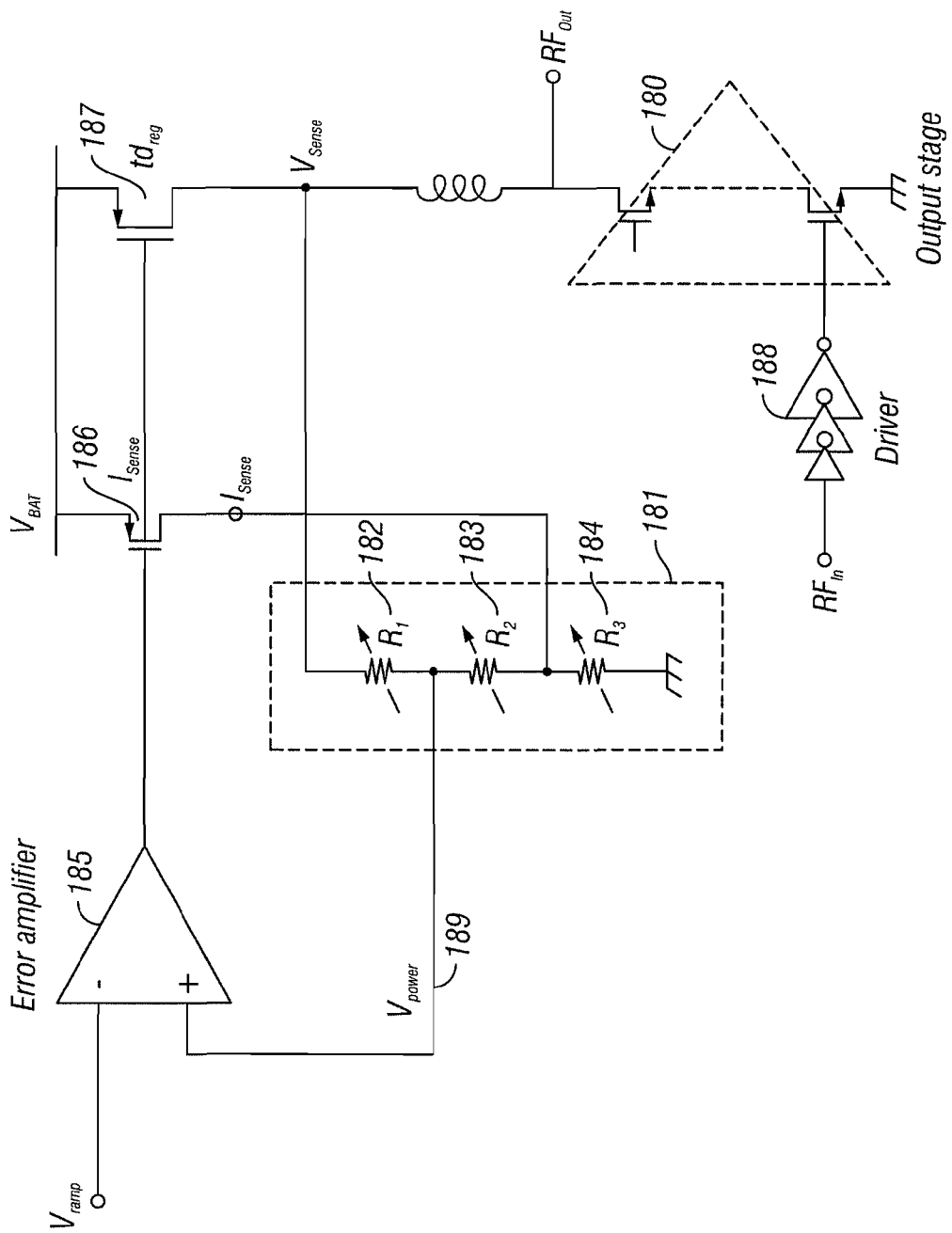

FIG. 18 is a schematic diagram of voltage mode signal processing of a V+I driver power amplifier power control loop in one embodiment of the present invention.

Figure 19:
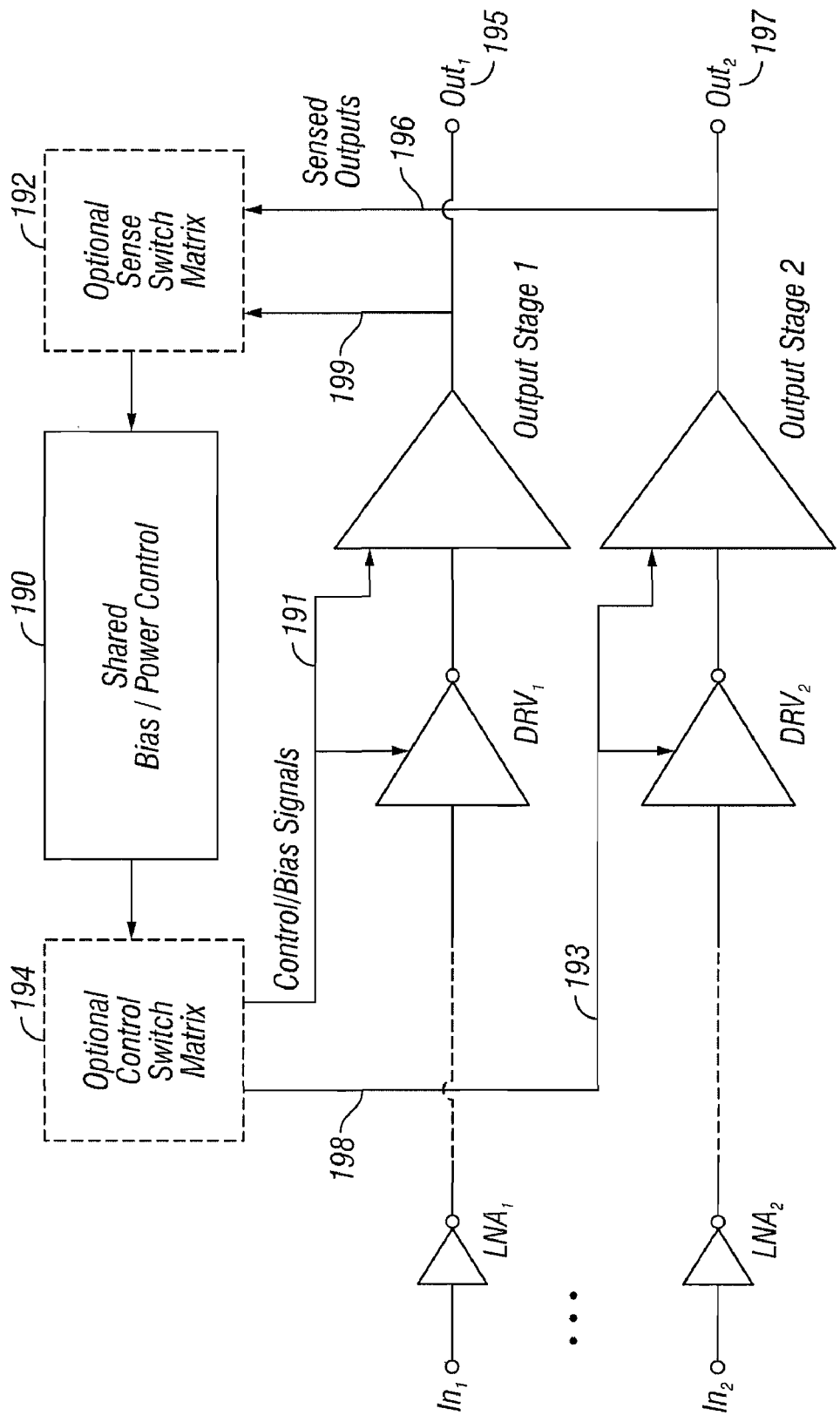

FIG. 19 is a schematic diagram of a power amplifier using a shared bias and/or power control circuit between bands and/or modes in one embodiment of the present invention.

Figure 20:
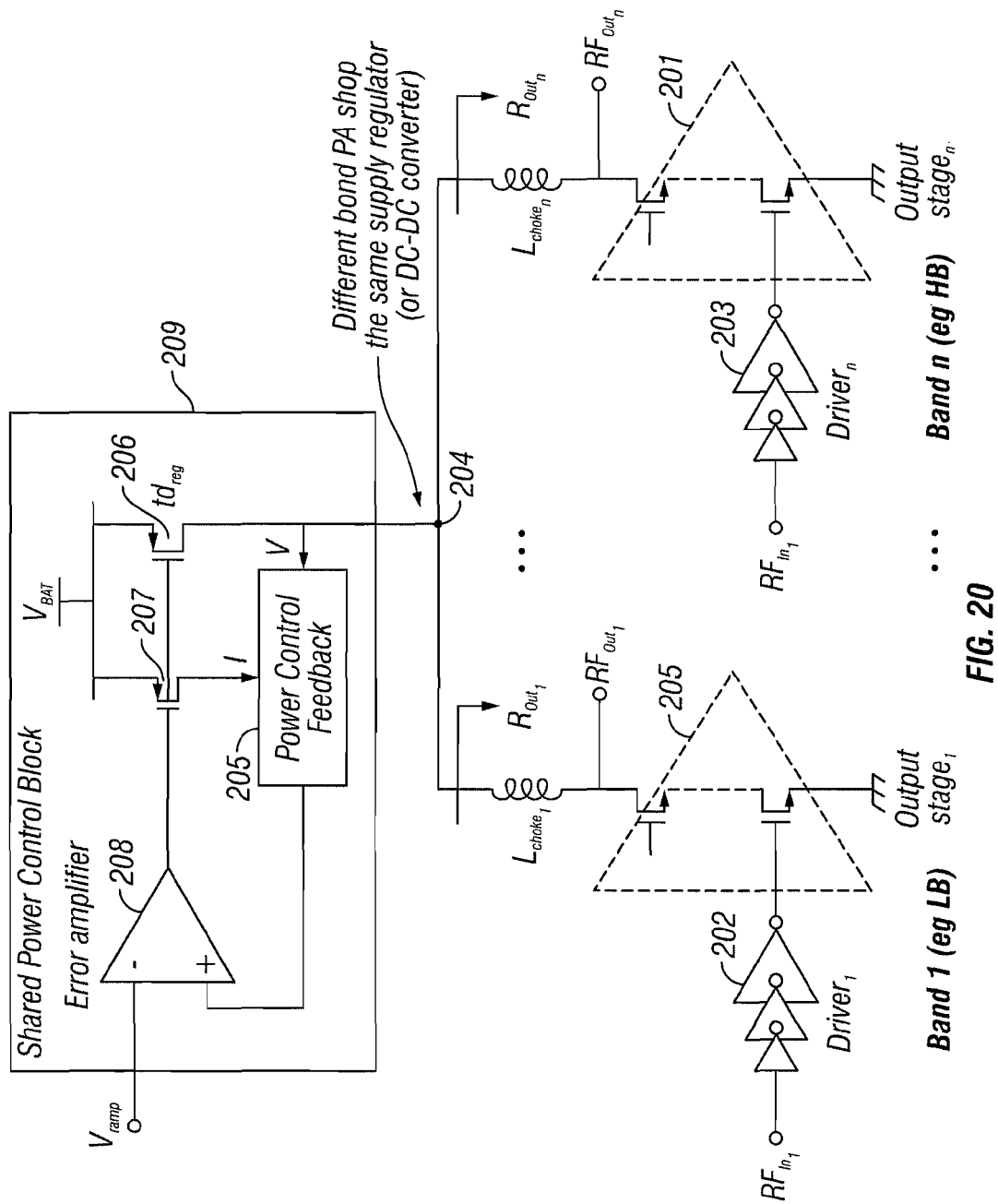

FIG. 20 is a schematic diagram of a power amplifier showing a drain power control regular between two or more bands in one embodiment of the present invention.

Figure 21:
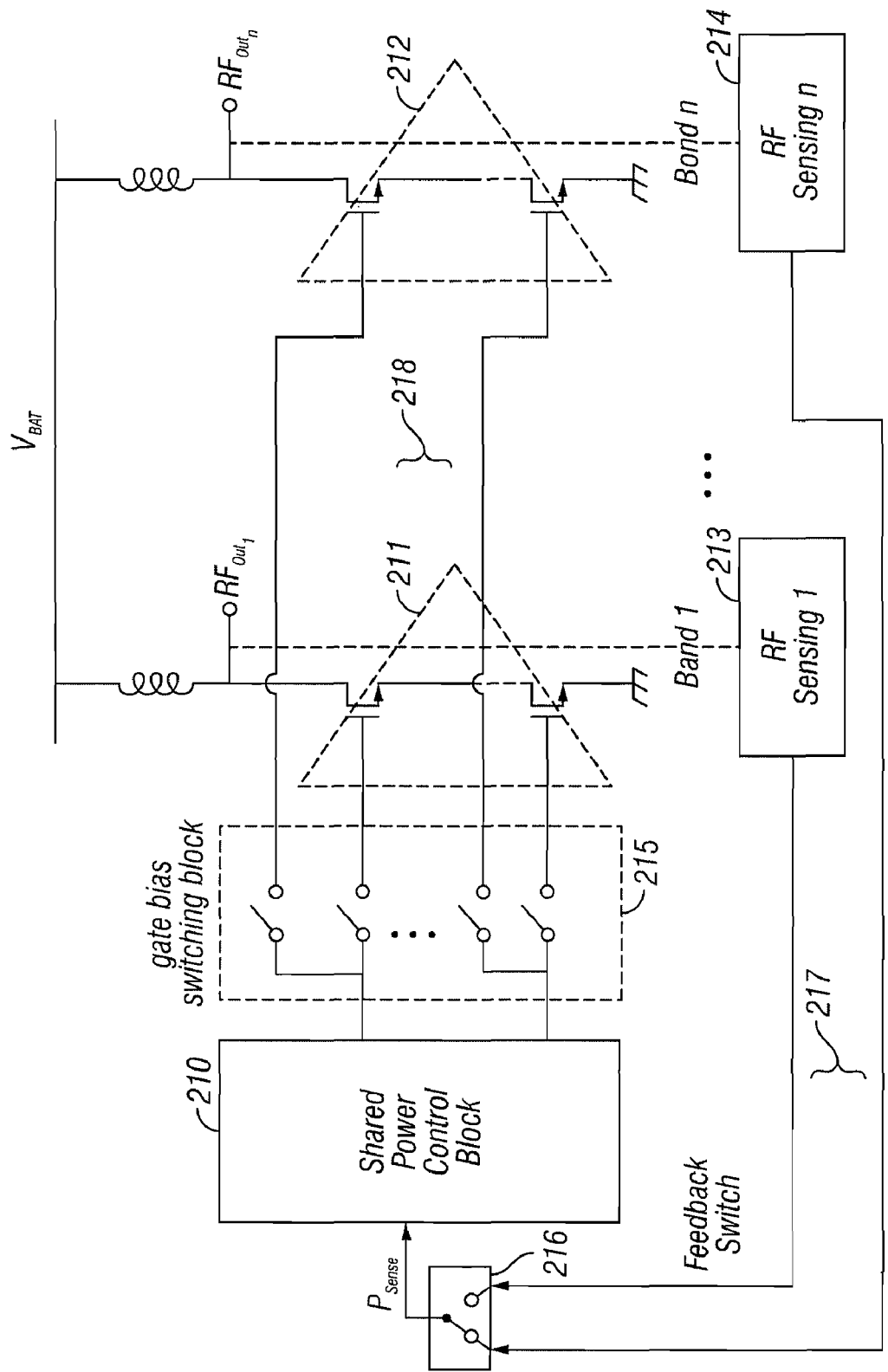

FIG. 21 is a schematic diagram of a power amplifier with a gate control loop between two or more bands in one embodiment of the present invention.

Figure 22:
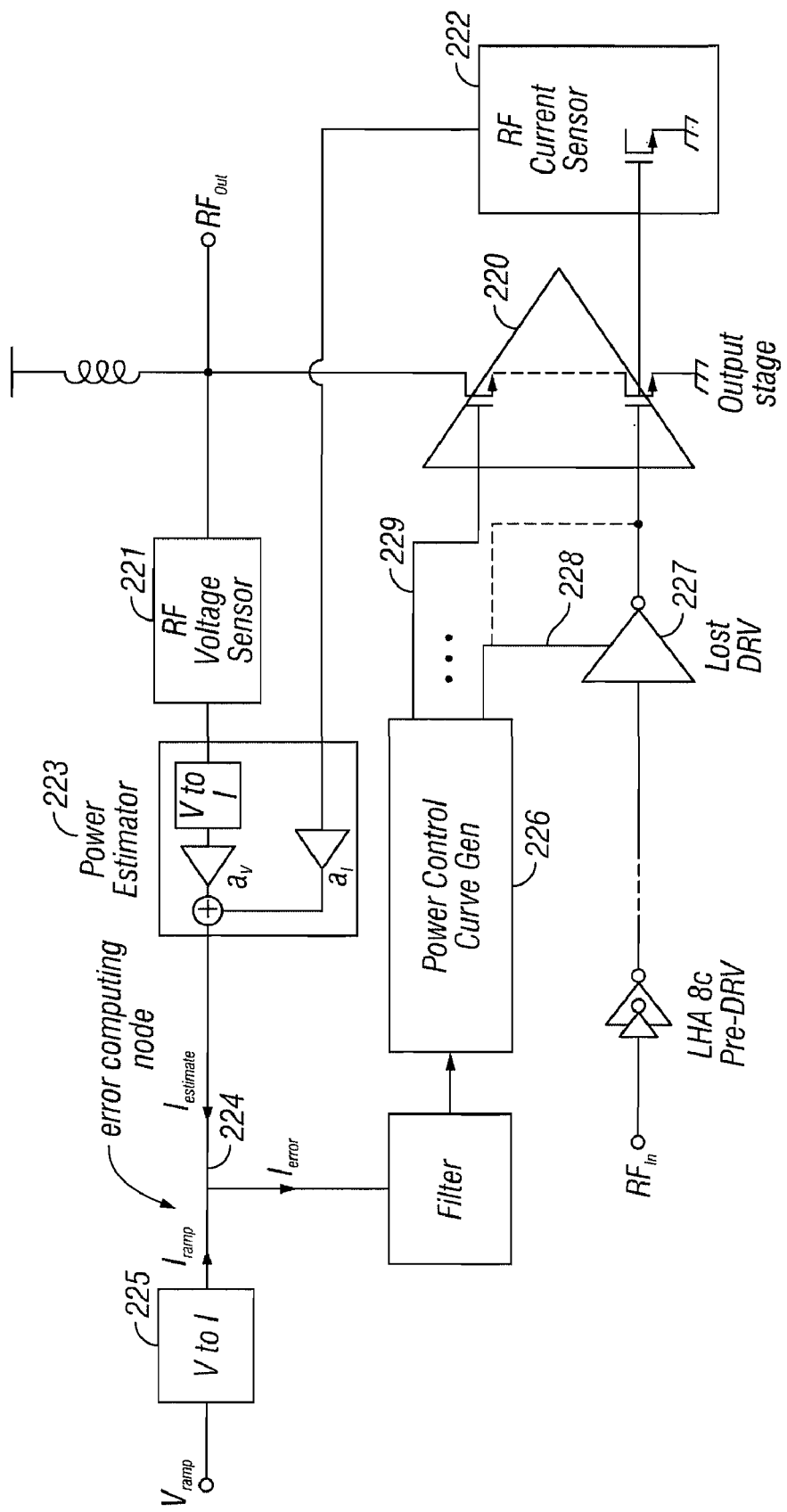

FIG. 22 is a schematic diagram of a power amplifier with gate power control and current-mode signal processing in one embodiment of the present invention.

Figure 23:
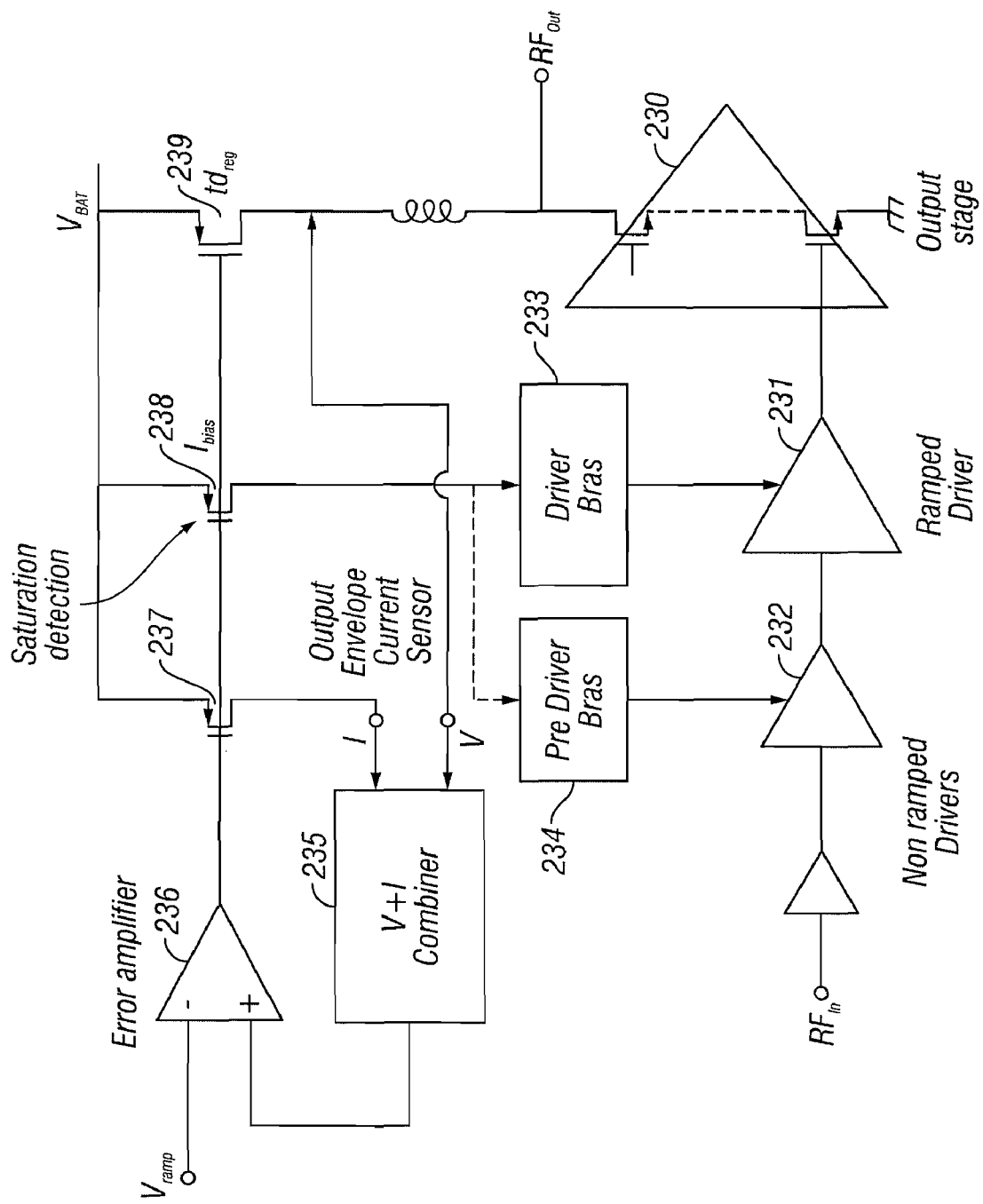

FIG. 23 is a schematic diagram illustrating control with more than a single mode within the power amplifier to ensure better efficiency in backed-off power operations in one embodiment of the present invention.

Figure 24:
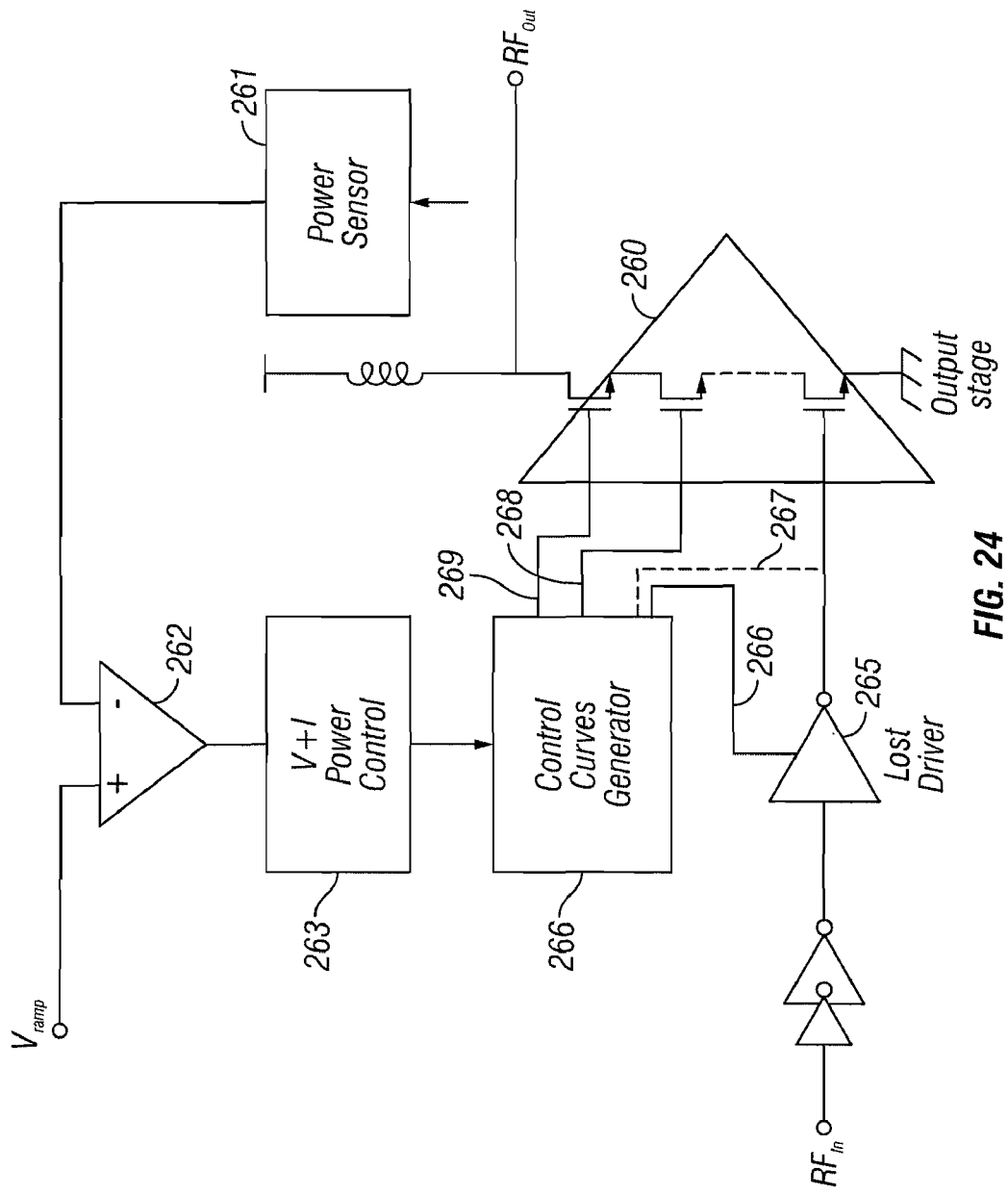

FIG. 24 is a schematic diagram illustrating a power amplifier with gate power control and multiple points of control in the signal path in one embodiment of the present invention.

FIGS. 25(a) through (c) are power control curves having, one, multiple inflection points or a continuous non-linear characteristic in one embodiment of the present invention.

FIG. 26(a) is a schematic diagram of a power control loop to achieve a more linear overall control characteristic in one embodiment of the present invention.

FIGS. 26(b) and (c) are graphs of a control curve and a power amplifier control function associated with the FIG. 26(a) embodiment in one embodiment of the present invention.

Figure 27B:
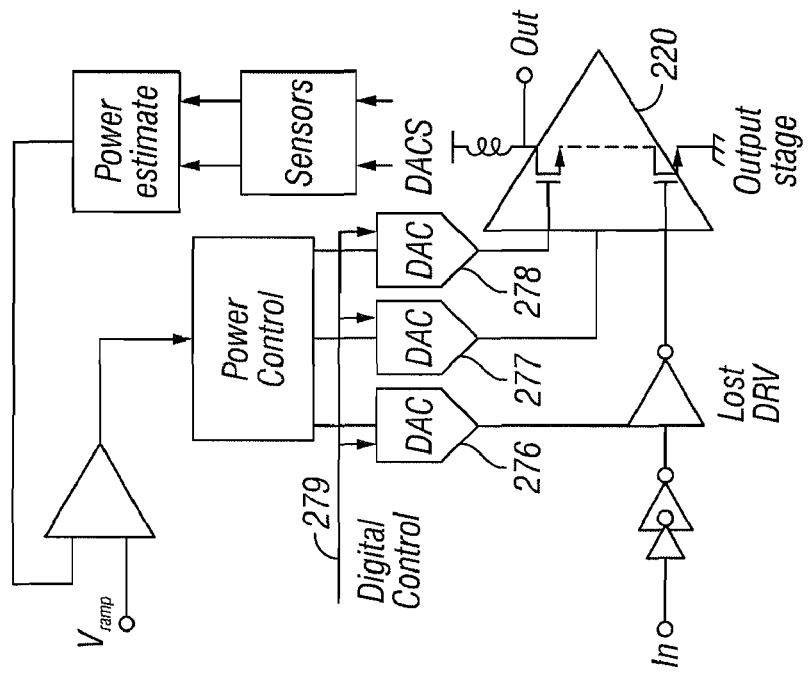
Figure 27A:
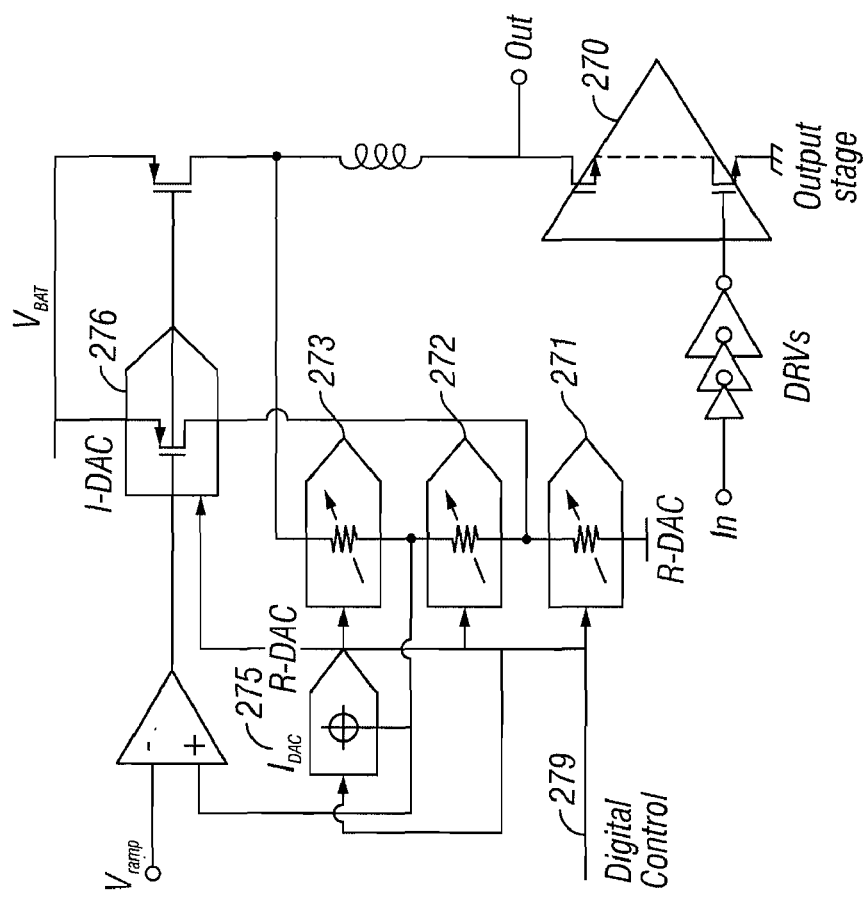

FIGS. 27(a) and (b) are schematic diagrams illustrating DACs to provide adjustability for the power amplifier power control loop with drain control and with gate control in one embodiment of the present invention.

Figure 28:
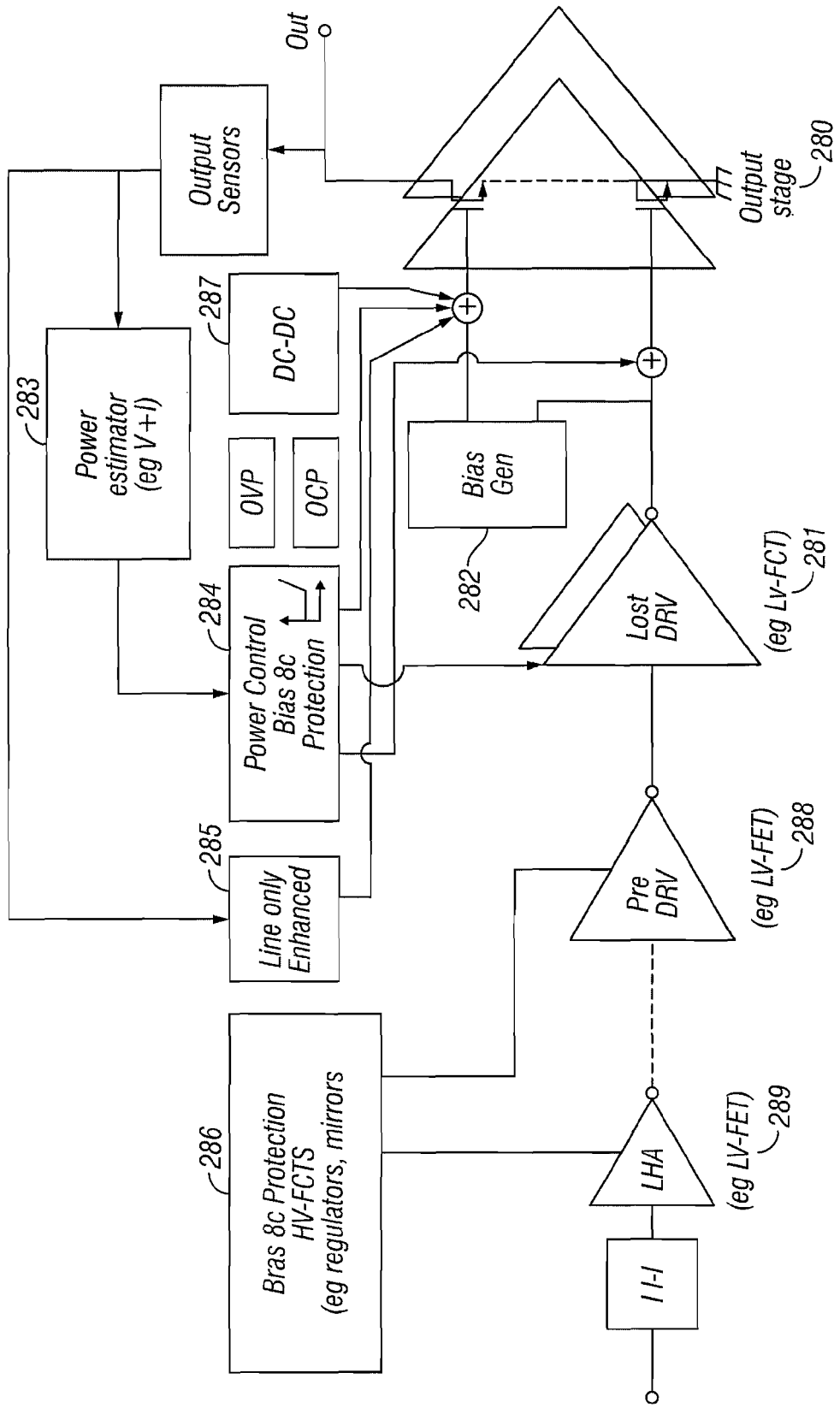

FIG. 28 is a schematic diagram of a power amplifier with different performance enhancements in one embodiment of the present invention.

Figures 29A, 29B:
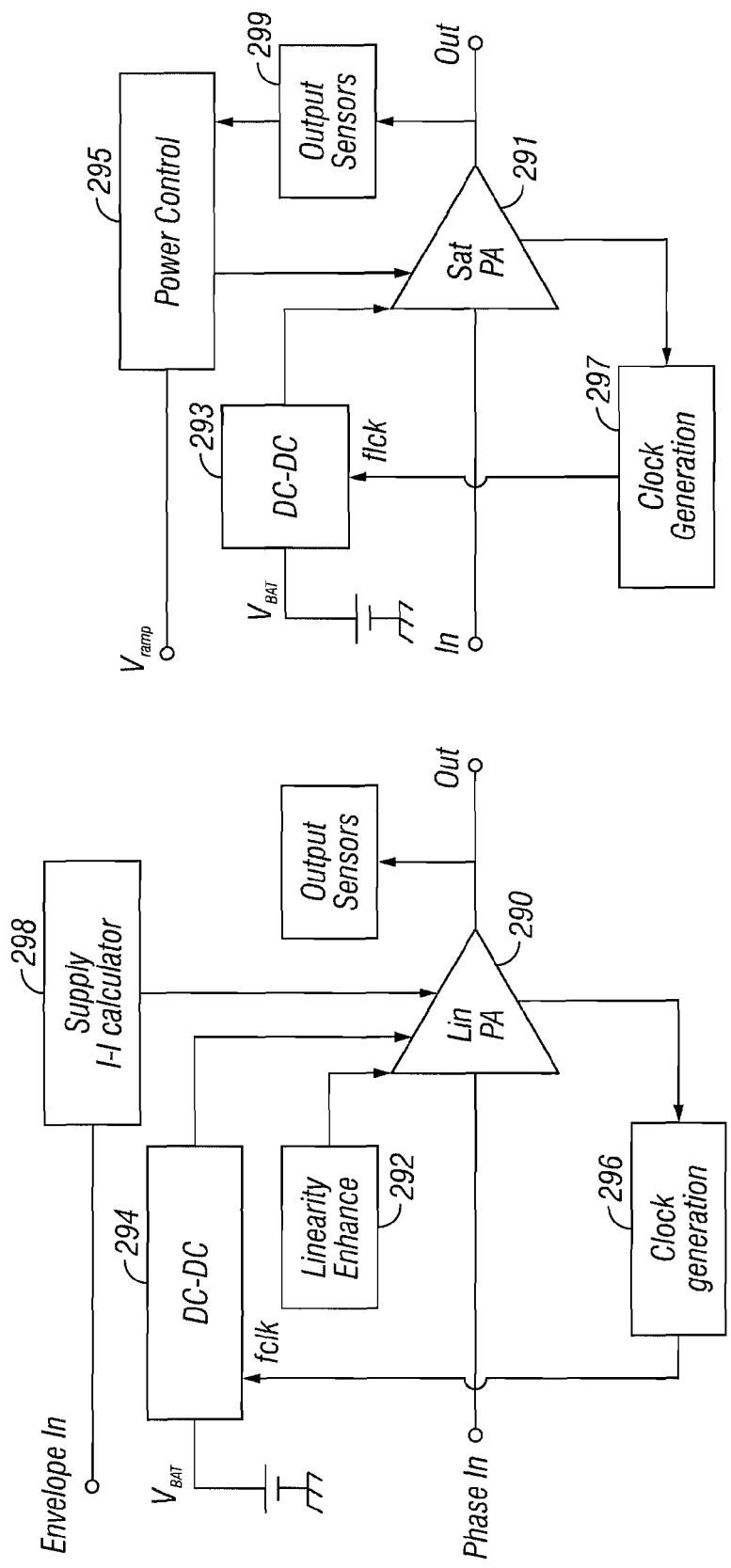

FIGS. 29(a) and (b) are schematic diagrams of a linear power amplifier and a saturated power amplifier using performance enhancements in one embodiment of the present invention.

DETAILED DESCRIPTION

In one embodiment, present invention is a power amplifier system 10 that provides for regulation of its output power level using power control feedback loops 18.

Achieving a given output power at the load 13, regardless of the specific design corner (e.g. load impedance corner, process corner, temperature corner, supply corner, operating frequency, etc) is an important task for a power amplifier system 10.

In many applications (e.g. the GSM/EGSM/PCS/DCS cellular phones) the transmitter is providing to the power amplifier an additional control signal 11 ($V_{ramp}$) that is a representation of the targeted output power level ($P_{target}$).

To get a certain output power level set by the $V_{ramp}$ signal, the power amplifier may need a feedback loop which senses/estimates the output power level on the load 19 ($P_{estimate}=P_{out}$) and compares it with the targeted level 11 ($V_{ramp}$) and the error signal is used to drive the power amplifier system 10 in the direction of minimizing the difference between the sensed and targeted power levels. The average (e.g. RMS) output power for a periodic signal can be computed as:

$$Pave = \frac{1}{T}\int_0^T v(t) \cdot i(t) * dt \qquad (1)$$

Computing the average instantaneous power level is not an easy task at RF frequencies. The signal in most communication systems carries a certain modulation that results in a time variation of the average power (envelope power or baseband power).

In many applications the load resistance is constant or approximately constant. In such cases the load power can be determined by looking exclusively to either the voltage level at the power amplifier system 10 output, or the current level at the power amplifier system 10 output.

However, in most modern communications and in particular the mobile communication systems, the antenna impedance is not constant and also may not be purely resistive. In the general case, the antenna impedance may have resistive, capacitive and/or inductive components which can vary in time due to such effects as multi-path interferences.

If the load resistance is variable the load power cannot be determined by sensing only one quantity: load voltage, or load current. In such cases, an output power sensing needs to be performed, which increases the complexity of the power amplifier system 10. One solution is for the power amplifier system 10 power control loop to use both voltage and current sensing at the same time in order to estimate correctly the output power. The reactive elements (capacitive and inductive) are not consuming any power, except for their resistive loss components.

The amplifier system 10 of the present invention provides mechanisms to convey the output power information to the power control loop 18. In the real circuit implementation the quantities that are sensed (measured) are the output voltage ($V_{sense}$) and the output current ($I_{sense}$). One embodiment of the present invention provides a power estimation circuit 16 that uses the summation of the sensed voltage and current, and does not require complex operations, such as multiplications.

Although the multiplication of two quantities is a nonlinear operation, in certain conditions it can be well approximated with the multi-variable linear combinational expression:

$$Pout = Vsense \cdot Isense \approx a_v \cdot Vsense + a_i \cdot Isense \quad (2)$$

Such a simple linear transfer function can be easily implemented with the circuit from FIG. 2(a). It involves two scaling blocks $A_V$ 22 and $A_I$ 24 and a summing block 26, all being functions that can be implemented with relatively simple electronic circuits. The signal processing required by expression (2) can be realized either in voltage, or in current-mode, or yet in a hybrid combination between the two.

The good approximation of the output power level by the V and I linear summation holds for more than one decade of load resistance variation and is sufficient for most power amplifier applications. An advantage of such a technique is its simplicity and robustness. The intrinsic (built-in) current limiting at high power levels may result in power control loop simplification, since it may not require an additional over current protection (OCP) building block. This embodiment of V+I summation provides for: simplicity and ease of implementation, and no need for complicated calibration procedures for process, temperature, supply and other design corner variations, and good accuracy for a reasonable wide range around the nominal impedance level.

Figure 1B:
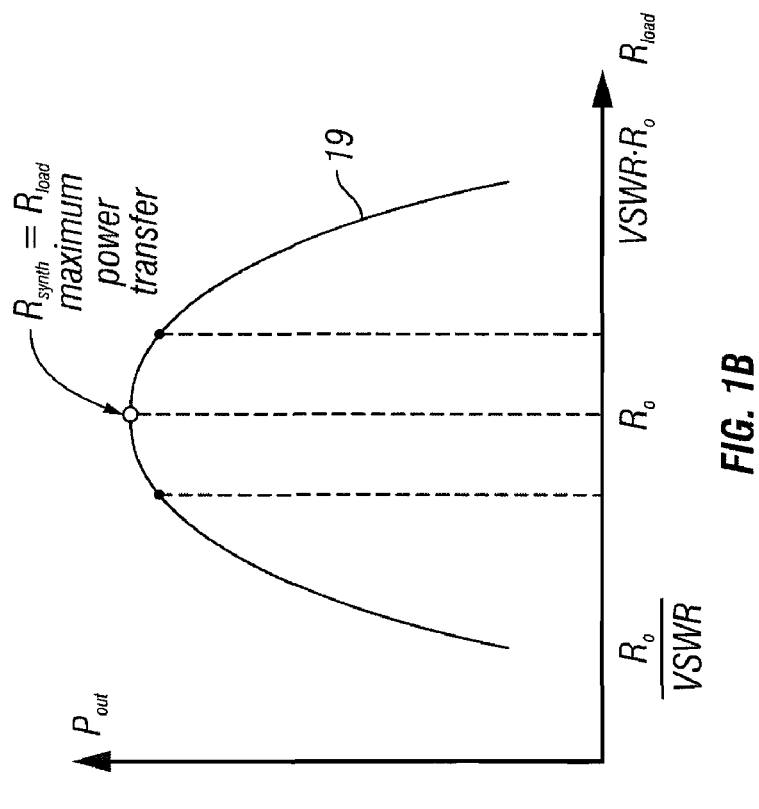
Figure 1A:
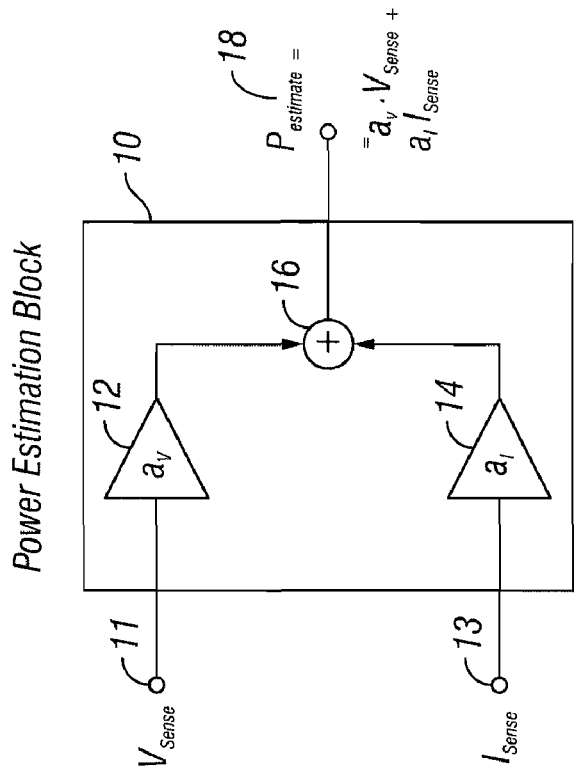
Figure 2:
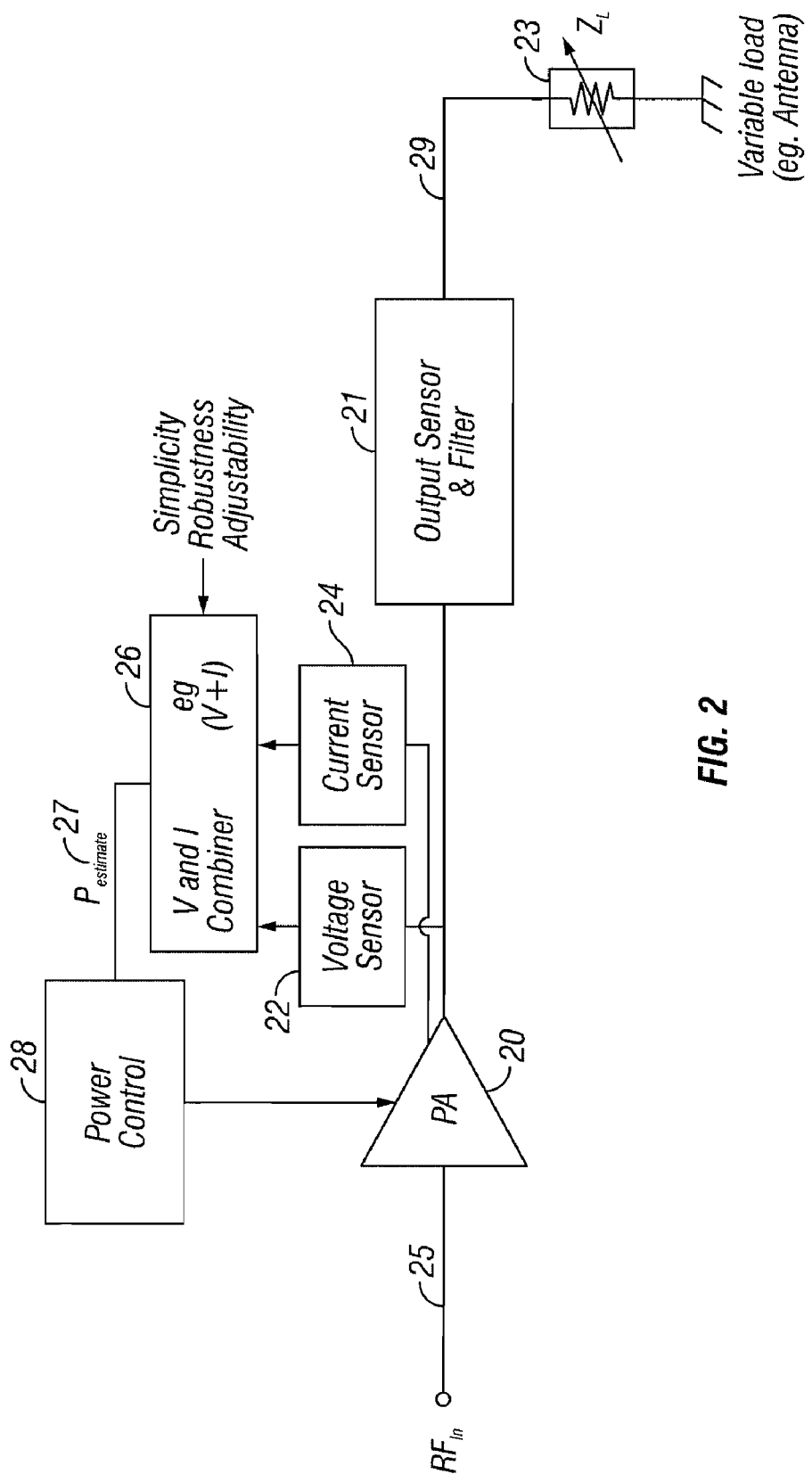

FIG. 2.b shows the parabolic characteristic (29) of the output power ($P_{out}$) as a function of the load resistance value ($R_{load}$). The maximum of this characteristic is achieved at the point where the synthesized power amplifier output impedance ($R_{synth}$) corresponding to its load line characteristic is equal to the load resistance value ($R_{load}$). When the load impedance changes and thus results in a given voltage standing wave ratio (VSWR), the load power changes from its peak value. For reasonable values of the VSWR (e.g. VSWR=3 that is typical for many practical antennas and mobile transmit environments) the power level is still very close from the nominal (peak) value.

Both RF and baseband sensing are possible the voltage sensor 12 and the current sensor 14. This embodiment uses a weighted summation of the sensed voltage and current to compute an estimate of the output power level.

After computing the estimated power level with the voltage and current summation 16 the resulting $P_{estimate}$ signal is used by a main power control engine 18 to determine the appropriate control for the power amplifier system 10 in order to determine the move of the output power in the direction of the target power level, or keep the output power close to the target level if it is already around it.

In this embodiment, both load voltage and current sensing are utilized and provides for robust output power level regulation over a wide load impedance variation range. To optimize the total radiated power (TRP) performance over a wide load impedance range (i.e. reduce its variation), this power control mechanism allows for an easier adjustability that can select between a balanced voltage and current feedback, when the sensed voltage and current contribute equally to the estimated power, a stronger voltage feedback, when the sensed voltage dominates in the estimated power calculation, a stronger current feedback, when the sensed current dominates in the estimated power calculation.

Achieving a target load power level for a given load resistance (impedance) value in a given design corner (power, temperature, supply voltage, etc) is equivalent with synthesizing a certain output impedance for the power amplifier system output stage. FIG. 2 illustrates a plot of the output power (Pout) as a function of the load resistance and has a parabolic shape. The maximum power transfer from the power amplifier system 10 to the load occurs when dPout/dI=0. This occurs when the synthesized output impedance of a power amplifier system (10) (Rsynth) equal the load impedance (Rload).

The load line equation is given by:

$$Vout = a_v \cdot Vin - Iload \cdot Rsynth = (g \cdot Vin - Iload) \cdot Rsynth \quad (3)$$

where g is the transconductance gain and $a_v$ is the voltage gain of the amplifier.

The feedback signal is a linear combination of sensed voltage and current.

$$Vfeedback = av \cdot Vout + ai \cdot Iout \quad (4)$$

which offers a power estimate for a wide impedance range.

Furthermore, the synthesized output stage impedance is given by:

$$R_{synth} = (I_{fb} \times R_{fb})/I_{load}$$

Where $I_{fb}$ is the feedback current, and $R_{fb}$ is the feedback resistance. The $I_{load}/I_{fb}$ current ratio between the load current and the sensed (feedback) current is usually given by the ratio of the sense current mirror.

At very high $R_{load}$ the feedback degenerates into a voltage only one, while at very low $R_{load}$ it degenerate into a current only one.

The linear multi-variable voltage and currents summation approximation of the output power is the simplest one but by no means the single one. Higher order multivariable polynomial approximations can be developed as shown in the following equation:

$$Pestimate = av \cdot V + ai \cdot I + av2 \cdot V^2 + ai2 \cdot I^2 \quad (5)$$

One special category of polynomial approximations is the one that uses a summing followed by a power, as shown in FIG. 3.a:

$$Pestimate = (av \cdot V + ai \cdot I)^K \quad (6)$$

From all these possible higher order approximation, the second order ones are the simplest, as shown in FIG. 3.b:

$$Pestimate = (av \cdot V + ai \cdot I)^2 \quad (7)$$

Figure 3A:
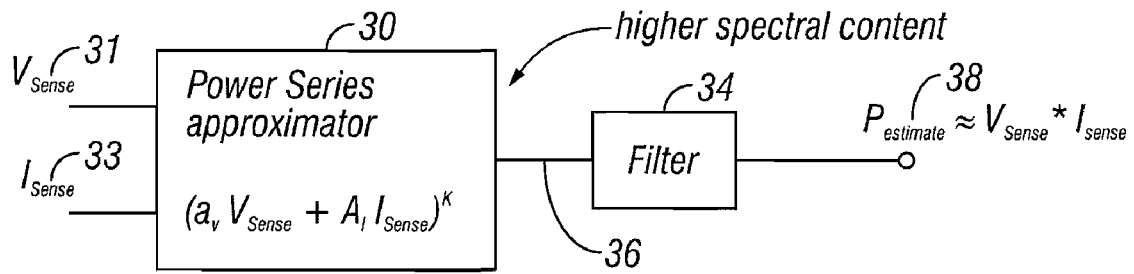
Figure 3B:
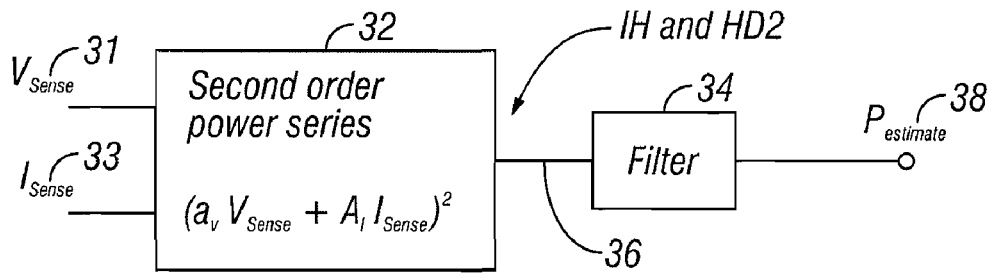

Because the higher order power combining expressions create high frequency harmonic components (e.g. squared voltage, squared current, etc.) a back-end filter 34 is provides, as illustrated in FIGS. 3(a) and 3(b). There are many ways to implement such higher order estimates of the output power. A method is the linear (first-order) polynomial with multiple variable approximation of the output power and has advantages for low-cost implementations.

Voltage and current are different quantities that cannot be combined directly. In order to generate the estimated power level, the two quantities need to be brought in the same domain: voltage or current. Such operation can be achieved by using either a voltage to current converter (V-to-I), or a current to voltage converter (I-to-V).

FIGS. 4(a) and 4(b) illustrates two mechanisms for performing the signal processing for the power control sensing circuit of the present invention. In one, voltage-mode signal processing illustrated in FIG. 4(a), the sensed current 41 is converted into a voltage with the I-to-V block 42. This can be as simple as a resistor ($R_{ItoV}$) 48 that performs the conversion, or a more sophisticated amplifier. The voltage sensor may need an optional phase alignment circuit 44 which ensures that the two voltage inputs of the linear combination block 46, which performs the voltage and current summation, are approximately in phase. In a second one, current-mode signal processing shown in FIG. 4(b), the sense voltage 40 is converted into a current with a V-to-I block 43. This may be as simple as a $R_{VtoI}$ resistor 49 and a current sensing device, or a more sophisticated amplifier circuit. The current sense path may require an optional phase alignment block 45.

In the general case, since phase is periodic with 360 degrees, phase alignment can be done in either of the two signal paths: voltage and current sensing. For baseband voltage and current sensing the phase difference between voltage and current are small in comparison with the delays in the associated circuits. Therefore it may not be needed to use phase alignment blocks. In contrast, for RF voltage and current sensing, the delay of the signal processing blocks is comparable with the period of the RF signal and thus the phase alignment blocks may be needed.

Voltage-mode signal processing may require active stages to perform addition and subtraction and can be more sensitive to the ground noise and parasitic noise coupling. Both the voltage and current mode and even a hybrid of voltage and current mode signal processing can be used in conjunction with the power amplifier system 10 of the present invention.

Figure 5:
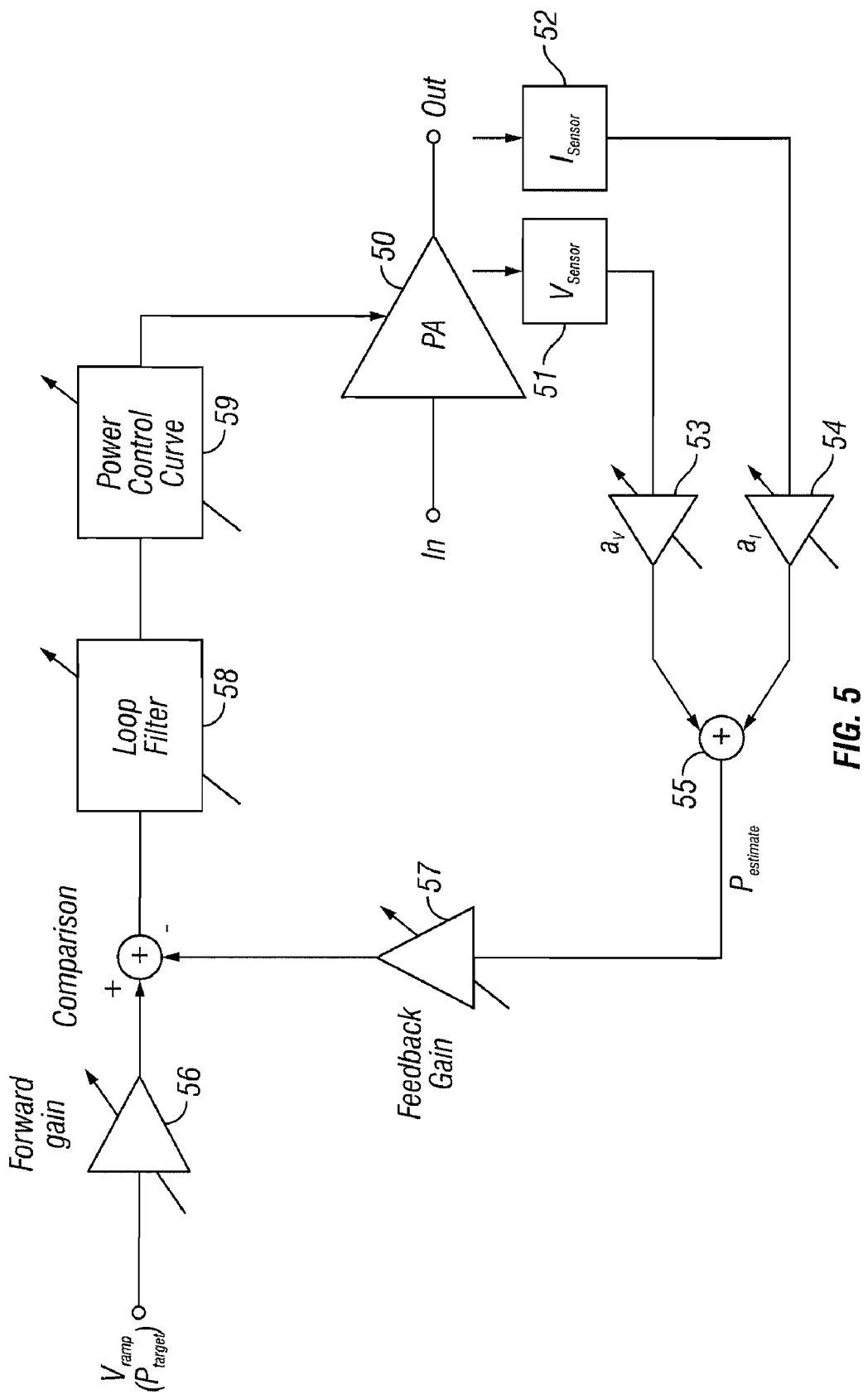
FIG. 5 is a schematic diagram illustrating a power amplifier using a power control loop having a linear voltage and current summing estimates of output power in one embodiment of the present invention.

FIG. 5 illustrates an embodiment of power control loop 100 based on the linear summation of the sensed output voltage 51 and current 52, used within a power amplifier system. The FIG. 5 embodiment can be implemented by using voltage-mode or current-mode signal processing. This embodiment can use voltage amplifiers ($A_V$) current amplifiers ($A_I$) transconductance amplifiers ($G_M$) and trans-impedance amplifiers (Z).

The targeted power level provided as a voltage ($V_{ramp}$) by the transmitter is processed by a forward path amplifier system 56, followed by a subtraction circuit 501 that subtracts the feedback power ($P_{feedback}$) computed as a gained version of the estimated output power (P estimate), which in turn is estimated with the voltage and current sensors 51 and 52 respectively and associated amplifiers 53 q and 54. The error power ($P_{error} = P_{target} - P_{feedback}$) is filtered by a filtering stage 58, that can be an integrator which drives the power amplifier system 50 through a power control block 59. The feedback loop time constant and behavior is determined by the gains of the different constituent amplifiers and the frequency response of the loop filter.

In many cases a single power control loop 100 needs to drive two or more signal path amplifiers (e.g. low band and high band, or GSM and WCDMA) which have different output power levels and thus need different output impedances to be synthesized. Also, the power amplifier systems 50 can operate over a wide design corner space including supply voltage, temperature, process, frequency, process, power level, and the like. Therefore, having adjustability included in the power control loop 100 can be desired. Both the time constants and the loop gain may need to be adjusted in order to ensure a well behaved response.

Figure 6:
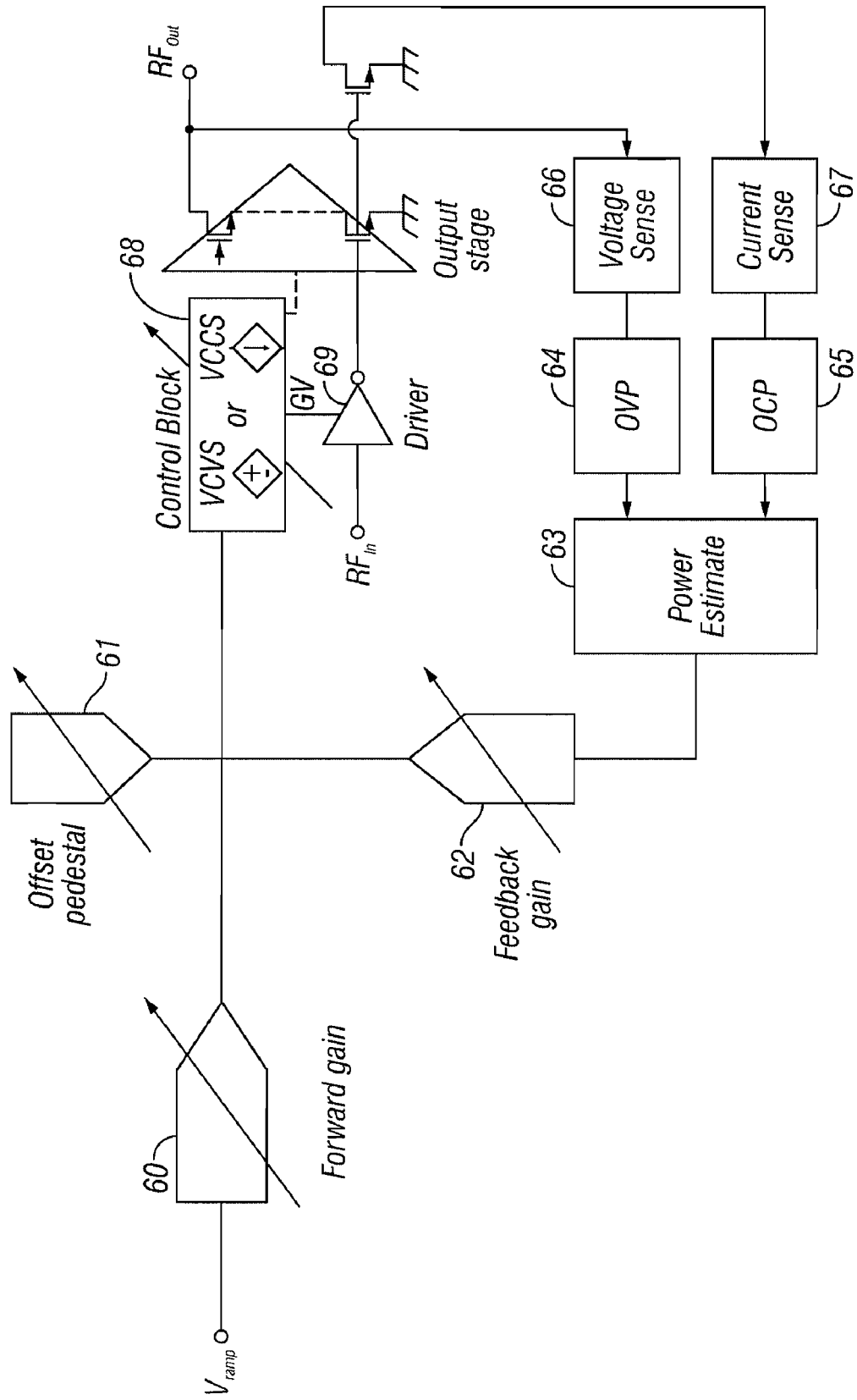
FIG. 6 is a schematic diagram of a power control feed back loop/effect adjustment with voltage or current mode signal processing in one embodiment of the present invention.

FIG. 6 illustrates an embodiment of the power amplifier system 10 showing the different points that can be used to implement adjustability of, forward gain 60, feedback gain 62, the pedestal offset 61 and the power control block 68. This adjustable power control can be applied to both gate control, as shown in FIG. 6, and the drain control, or any combination of the two.

For simplicity in many cases only one point of adjusting the gain is used for the power control loop 100 of the power amplifier 10. FIG. 7(a) illustrates an embodiment using a feed-forward path 73 gain adjustment. In FIG. 7(b) the feedback path gain adjustment is given by 75. To impact the behavior of the feedback loop 100 the forward gain of the path included in the power control loop 73 is changed. If the stage used as adjustable gain is in the forward path, but outside the feedback path 71, then this does not change the behavior of the power control loop 12, but merely changes the input signal level that provides the target power. Therefore, it impacts the output power level of the given $V_{ramp}$ voltage, but does not change the loop dynamics (stability, settling time, and the like).

The linear combination of voltage and current, output power estimation embodiment of the present invention can be used with any kind of power amplifier regardless of the technology used for implementation (CMOS, bipolar, GaAs and the like) and also for any class of operation (e.g. class E, B, C, AB, EB and the like). Furthermore, the present invention can be applied to all existing types of power amplifiers, including saturated power amplifiers, linear power amplifiers, or power amplifiers that first operate linear and then go into saturation as the power approaches the peak level.

FIG. 8 illustrates an embodiment of the present invention of control power loop 100 and power amplifier system 10 using two types of output power sensing. The first one is baseband (BB) sensing, as shown in FIG. 8(a), when the voltage and current are already in their envelope form and thus the sensors 82 and 84 can directly drive the linear summation power estimator block. The second one is RF sensing of the load current and voltage, as shown in FIG. 8(b). This requires special RF-to-BB stages to extract the baseband (envelope) components before computing the load power with the linear summation.

The use of the first or second embodiments shown in FIG. 8 depends on the specific application and power amplifier system 10. If the power amplifier system output stage 80 uses a drain power control technique, than the supply regulator will already have the envelope voltage and current as its outputs, and thus the baseband approach can be utilized. In contrast, the gate power control method does not have a supply regulator, and thus the RF voltage and current sensing embodiment can be utilized.

If power amplifier system 10 has large margins for maximum device voltage and current (in particular for the output stage 90), then the power amplifier system 10 may be left unprotected to excess voltage and/or current. Such over-voltages and/or over-currents may result due to dynamic changes in the load condition, and any transient settling behavior that has poorly damped peeking. In many cases, to reduce the cost, the power amplifier system 10 can be implemented using semiconductor processes that have very little margins for the over-voltage and/or over-current stresses in typical operating conditions. Therefore, during their operation the voltage and/or current of the high power output stages 90 may experience over-voltage and/or over-current stresses. Preventing the operation of the power control loop 100 in extreme voltage and current conditions can be achieved using over-voltage protection (OVP) 92 and over-current protection (OCP) circuits 93 that follow the voltage 95 and current 94 sensors and which work in conjunction with the power control loop 100, as shown in FIG. 9. There are many ways to implement OVP and OCP circuits, each one having a specific way to work with the power control loop 100.

The power level at the load is determined by the load current and load voltage and therefore they are dependent on the current and supply voltage of the last active stage 101. When considering a typical cascode output stage 101 for the last stage of the amplifier (single ended, differential, or quadrature), there are different techniques to exercise the power control as shown in FIGS. 10(a) through 10(c).

In the FIG. 10(a) embodiment the drain (collector) power control is used. The peak output voltage is set by the DC bias voltage applied to the output stage 101 through a large isolation inductance 107. The output stage 101 which typically operates in a saturated mode, is hardly driven in the case of constant envelope (nonlinear). It is hard to implement the drain power control for the case of linear power amplifier systems. This power control can accommodate both RF and baseband voltage and current sensing, with baseband being more popular due to its simplicity and robustness.

In the FIG. 10(b) embodiment, main gate (base) control is used. In this embodiment, the supply voltage to the output stage 101 is constant (e.g. the battery voltage) and the power control is realized by adjusting the drive level of the input device of the output stage 101. The higher swing of the driving voltage results in a larger current in the output stage 101 and thus for a given load resistance to a higher load power. In this embodiment, the output stage 101 operates most of the time in the linear regime and may operate saturated only for the last few [dB] of the output power level.

In the FIG. 10(c) embodiment, the cascode gate (base) control is used. In this embodiment, the supply for the last high-power stage 101 is held constant and the bottom device (main gate) is driven hard 108, while the voltage level of the cascode gate 109 is changed in order to achieve output power variability. In this embodiment, the bottom device is switched hard and goes from off to a triode regime. In this embodiment power control through the cascode gate can be lower and may require very wide ranges for the cascode gate voltage. To improve the control range more than one cascode gate can be used to change the output power level as shown with the dashed line in FIG. 10(c).

In another embodiment, a combination of the above methods can be used. One possibility is to combine the drain control with the gate control. Another possibility is to combine the main gate control with the cascode gate control. In these hybrid embodiments, it may be the case that one method is used as the main power control technique (e.g. main gate control) while the other method is auxiliary and used for reducing the control ranges and improving reliability (e.g. cascode gate control). The present invention can work in conjunction with any of the existing power control circuits disclosed herein.

FIGS. 11(a) through 11(c) illustrate different embodiments of drain power control. Referring to FIG. 11(a), a supply regulator (modulator) 112 is used to change the output power level. Supply regulator 112 can be an Opamp with PFET output device based regulator. The supply regulator 112 has an output device that carries the output envelope current while the voltage at the supply regulator's output is the output envelope voltage. These envelope signals can be directly used by the power sensing circuit, simplifying its architecture.

In the FIG. 11(b) embodiment, a supply DC-DC converter 114 is used, which has the advantage of better power efficiency when compared with a linear regulator.

The FIG. 11(c) embodiment uses any other power control circuit 116 that achieves the goal of changing the supply voltage of the output stage 110 in response to the difference between the target ($V_{ramp}$) and the sense ($P_{sense}$) power level.

As previously mentioned, the output power level can be monitored by sensing the baseband output voltage and current. FIG. 12 illustrates an embodiment of the power amplifier system output stage 120 using a drain power control technique implemented with a supply regulator that has a PFET output device 129. The baseband output voltage is directly available at the regulator's output, while the baseband output current is passing through the 129 $M_{reg}$ regulator's output device. It can be easily sensed with a small size parallel device 121 $M_{sense}$ that uses the same current density with the main 129 $M_{reg}$ device. This embodiment provides direct and easy sensing of the power amplifier system baseband output voltage 122 and current 123 that can be used by the power control loop 126.

The size of the $L_{choke}$ isolation inductance influences the cleanness of the baseband voltage and current components. If this inductance has a relatively low value (due to area and cost-saving) then the sensed voltage and current may have significant residual RF components and may need additional filtering 124 before driving the power estimation block 125, as shown in FIG. 12. In general, if a drain power control technique is used, then the baseband voltage and current sensing is easier to implement when compared to its gate counterpart.

FIG. 13 shows an output stage 130 embodiment where gate (main, cascode, or hybrid) power control is used. In this embodiment, the output stage 130 supply is constant and comes directly from the battery. The baseband output voltage and current are not directly available. In this embodiment, to compute an estimate of the output power level, the envelope versions of the output voltage and current are used. The RF output voltage present at the power amplifier system output node needs to be converted into its envelope component. There are several ways of performing this RF-to-BB task, any of them being usable in conjunction with this invention.

FIG. 14 illustrates an exemplary embodiment of the voltage and current linear summation driven power control loop 100 that uses the drain control method implemented with an OpAmp based supply regulator 145. There are several ways of performing the signal processing: voltage-mode, current-mode, or hybrid voltage & current mode. In FIG. 14 a voltage-mode signal processing is used. The envelope output voltage $V_{sense}$ is sensed directly at the regulator's output 141, while the current is sensed with a current mirror leg $M_{Isense}$ 142. Because the signal processing is performed in the voltage domain a current to voltage (I-to-V) converter 143 is needed in the $I_{sense}$ path, before the voltage and current linear summation can be performed 144. In the voltage-mode signal processing, the error amplifier 145 is implemented with a voltage amplifier (i.e. an operational amplifier) and the feedback network 144 is a voltage feedback. As can be seen in FIG. 14, the voltage-mode processing of the baseband sensed voltage and current is easy to implement for the drain power control technique. A careful stability analysis of the feedback loop 100 needs to be performed. Additional feedback paths may be added to the structure from FIG. 14 to provide an efficient wide output power control range.

FIG. 15 shows an embodiment of the linear voltage and current summation driven power amplifier system power control loop 100 using a current-mode signal processing technique. In this case all voltages need to be converted into currents, in order to be processed by the current-input voltage-output error amplifier (transimpedance amplifier) 155. The target power level $V_{ramp}$ is converted into a corresponding current $I_{ramp}$ via a V-to-I converter 156. The sensed voltage and current are summed in the current domain 153 and the resulting estimated power represented by the $I_{power}$ current is compared with the target power input current $I_{ramp}$ at the input of the trans-impedance amplifier Z 155. In some cases the current mode signal processing can be advantageous due to its simple summation and subtraction by bringing the constituent currents at a given node 157. If all components are in the current mode the V+I linear summation and the error current computation can be done together at a single node by simply bringing together with the appropriate sign and scaling factor the. $I_{ramp}$, $I_{envelope}$ and $I_{venvelope}$ current components.

In many applications a given power control block may need to operate in different output conditions. Such situations are typical for the multi-band/multi-mode power amplifier systems. Different frequency bands (e.g. low-band LB and high-band HB) and different modes or communication standards (e.g. 2G, 2.5G, 3G, 3.5G, 4G, etc) may require different output power levels and thus will mandate the synthesis of different output impedances, corresponding to different load lines for the output stage. Such applications require adjustability /programmability of the power control block.

FIG. 16 shows exemplary embodiments of the power control loop based on voltage and current summation (linear or higher order) that has programmable gains in its forward and feedback paths. FIG. 16(*a*) shows a voltage-mode signal processing, while FIG. 16(*b*) shows a current-mode signal processing case. Furthermore, programmability can be ensured for the loop filter and the control curve generator. Easy places to build-in the programmability are: the output current sensing mirror 165, the I-to-V 163 and V-to-I 164 conversion blocks, and the voltage-mode 161 and current-mode 162 V+I feedback networks.

FIG. 17 illustrates an example of voltage-mode feedback V+I power control implementation using a resistive divider 171. The output stage 170 of the power amplifier can be modeled by its average equivalent resistance 179 ($R_{eqPA}$) shown to the supply regulator 1700 which has a PFET output device 174. To implement the proper $a_v$ and $a_i$ weighting coefficients of the voltage and current summation:

$$V_p\text{estimate} = av \cdot V\text{sense} + ai \cdot I\text{sense} \quad (8)$$

a proper setting of the two resistors from the divider (R1 178 and R2 177) needs to be done:

$$V_{p\text{estimate}} = \frac{R2}{R1+R2} \cdot V\text{sense} + \frac{R1 \cdot R2}{R1+R2} \cdot I\text{sense} \quad (9)$$

Because there are two unknowns (av, ai) and two known variables (R1 and R2), there are no degrees of freedom in this simple two resistor feedback network. It will be appreciated that the present invention can be used also with other types of feedback networks including but not limited to, passive, active or hybrid.

To add degrees of freedom to the feedback network, e.g., feedback loop 171, the number of components (e.g. resistors in the divider) needs to be larger than the number of known variables (av and ai). This will allow for optimizing additional elements such as the power consumption in the feedback network set up by the total resistance of the divider. FIG. 18(*a*) shows another embodiment of the voltage-mode V+I linear summation power control loop 100 using a three resistor feedback network 181. It's transfer function is:

$$V_{p\text{estimate}} = \frac{R2+R3}{R1+R2+R3} \cdot V\text{sense} + \frac{R3(R1+R2)}{R1+R2+R3} \cdot I\text{sense} \quad (10)$$

Having three components and only two known variables allows for example for the minimization of the power dissipation in the feedback network by choosing a high value for the total resistance, limited by the allocated area and the leakage current. There are also other choices for the quantity to be optimized by the feedback network component selection. Other networks having one or more degrees of freedom in setting the component values can be implemented for the linear summation voltage and current power control loop 100.

In one embodiment, as shown in FIG. 18(*b*), at least a first switch 1800 is provided to select a feedback 1801, 1802 and 1803.

In one embodiment, the summation is performed by a short 1806. In other embodiments, the summation is performed by amplifiers 1807, a switch with multiple current feedbacks, a DAC, a rectifying device and the like. As non-limiting examples, the summation can be, 3 to 1, 6 to 1, 8 to 1 and the like.

The summation can be a linear combination of sensed current and voltage feedback 1801 and 1802. The summation provides power feedback 1808 over a wide range of load impedance, and then changes to a voltage limiting or a current limiting as a load conductance changes over a broad range.

In the ideal situation, maximum power transfer occurs when the following condition is met:

If $dP/dI=0$, and in this case, the synthesized power amplifier output resistance $R_{synth}$ equals the load resistance $R_{load}$ As non-limiting examples, the wide range or load impedance I can have 1% control within −20% load impedance, 1% control at −10% load impedance, 4% control within −20% load impedance and the like.

The summation can be on the feedback resistor divider 181, with current sense coupled to the resistive feedback divider 181 acting as power feedback 189. In one embodiment, the current feedback 162 is a scaled sense current feedback. The sense current feedback can be a percentage of the feedback 186 under a normal load. As a non-limiting example, the sense current feedback can be scaled to less than 50% of the feedback under a nominal load 13, and the peak power then increases marginally under high conductive loads with a small voltage increase under low conductive load.

The current feedback 186 can be restricted in one direction over current to avoid positive voltage corrections under a low conductive load. The current feedback 186 can be scaled with the conductance of a resistor of the same type as the voltage feedback resistor divider 181.

In one embodiment, in response to load conductance changes over a broad range, voltage limiting or current limiting is changed.

In one embodiment, in response to increasing a feedback factor due to adding current feedback 186, a feedback resistor ratio is adjusted to restore a same nominal gain under a nominal load.

In one embodiment, in response to a bad load an alert is provided.

In many situations the power amplifier system may need to operate over multiple frequency bands, or even multiple modes (standards) of communication. A typical example of a multi-band power amplifier is when it needs to cover a low-frequency band (e.g. GSM 850, EGSM 900, etc) and a high-frequency band (PCS 1800, DCS 1900, etc). An example of multi-mode operation of the power amplifier system is when it needs to cover multiple communication standards, or modes of operation such as: GSM, EDGE, WCDMA, etc.

Since the power control block takes a considerable are, reducing the area and thus cost of the power amplifier system can be realized by sharing the power con troll infrastructure between the signal paths dedicated to multiple bands and/or multiple modes. FIG. 19 shows the principle diagram of a multi-band and/or multi-mode power amplifier system that shares the power control and/or the biasing circuit 190 between multiple signal paths 195 and 197. Each signal path may have specific output sensors 196 and 199 and therefore an optional sense switch matrix 192 may be needed to select the appropriate sensed quantities for the power control block. Also, the different signal paths may use common, or separate control ports 191 and 193, requiring an additional control switch matrix 194.

The supply regulator 209 used for the drain power control tends to be very large in size, particularly due to the output device 206 that needs to have a very low on-state voltage and operate in saturation even at low supply voltage levels. Other elements that tend to take large area in the supply regulator 209 are the compensation network (e.g. compensation capacitors). FIG. 20 illustrates a way of saving area in multi-band power amplifiers when two or more signal paths 200 and 201 that implement individual communication bands or modes are sharing the same supply regulator 209 used for power control purposes. Since the power control loop 100 is using an envelope voltage and current sensing after the $L_{choke}$ inductors a single power control feedback network 100 is needed. Supply regulator 209 sharing brings significant area and thus cost savings.

A similar solution of power control block sharing can be implemented for the power amplifier system 10 using gate power control schemes, as shown in FIG. 21. A gate bias switching block 215 can be used to bring the control voltages from the output of the common power control block 210 to the individual gates of the output stages 211 and 212 corresponding to different bands. Since in the case of gate power control the direct baseband sensing is not that easy to implement and the RF sensing is the more straightforward technique, an additional feedback switch 216 is needed to select the output of the corresponding RF sensor 213 and 214. The need for the additional switches when sharing the power control block between multiple bands using the gate power control scheme makes this solution less attractive.

FIG. 22 presents a preferred embodiment of the linear V+I summation power control loop 12 using the current-mode signal processing and the gate power control technique. The targeted output power level given by the $V_{ramp}$ voltage provided to the power amplifier by the transmitter is converted into an $I_{ramp}$ current buy a V-to-I converter 225. The RF output current is sensed by the current mirror leg 222 off the output stage 220 main current path. The sensed RF current is converted into its baseband component inside the sensor. The error current ($I_{error}$) obtained by comparing the targeted power ($I_{ramp}$) and the estimated output power ($I_{estimate}$) currents is integrated on the power control loop filter 2200 before driving the power control curve generator 226 which gives the control voltages and currents needed by the output stage and its driver stage 228 and 229. If a gate power control technique is used, the control signal for the driver stage determines the signal swing at the main gate of the output stage 220 and thus indirectly sets the output power level. A voltage-mode dual power control implementation can be also developed for the embodiment from FIG. 22.

One important aspect of the power amplifier 10 of the present invention is the optimization of its efficiency at backed-off power level. Although many power amplifier designers may focus predominantly, or exclusively on the power amplifier system 10 efficiency level at maximum output power levels, this is not usually the best approach since in real communication applications the power amplifier system 10 spends most, or at least a significant percentage of time at power levels lower than the maximum rated power. Using a single point of power control in the entire power amplifier system 10 signal path is not capable of giving a multi-slope control characteristic needed to improve the efficiency at backed-off power levels.

FIG. 23 illustrates an alternative embodiment of the drain control, linear V+I summation based power control scheme using multiple control nodes 2300, 2301, 2302 in the signal path. The main power control point is still the regulator output 2300 that biases the output stage 230, but an additional control loop 2301 is provided by making the bias voltage of the last driver stage 231 being dependent on the output stage envelope current sensed by the $M_{bias}$ device 238. In this way the bias voltage of the driver is rapidly increased as the output stage 230 goes into saturation, when the larger output power is insured mainly by increasing the output current level. Ramping-up the supply voltage of the last driver stage 231 when going towards the peak rated power level helps reducing the efficiency degradation as the power is backed-off from the peak rated level. It is possible to further optimize the power amplifier system 10 efficiency by ramping more than just the last driver stage 231 (e.g. making the bias voltage of the pre-driver 232 be output current dependent as shown with dashed line in FIG. 23. In general using both output stage 230 and driver 231 (an even 232) parallel power control dependency leads to power amplifier system 10 architectures that have better backed off power efficiency.

A similar multi-control point power control loop 100 can be implemented for the gate power control scheme, as shown in FIG. 24. The main power control mechanism is through changing the control signal 246 of the last driver stage 245 that in turns changes the swing of the signal at the main gate and thus determines the peak current in the output leg 240. As control signals for the last driver stage, both its bias voltage and its bias current can be used. For the output stage the control ports can be one or several of: the main device gate and the cascode device gates. By adjusting the cascode voltages 248 and 249 of the output leg 240 using different slopes at certain threshold points, a transfer characteristic with an inflection point 250 can be obtained (see FIG. 25), which conducts to better efficiency at backed-off power level. In the case of the gate power control technique the output stage 240 operates linear most of the time, and only for the last few [dB] in the vicinity of the rated power it goes into saturated operation. When this happens the controllability of the power control loop 100 decreases significantly, reducing the tuning and adjustability options. Since the cascode gate voltages are also impacting the output power level, having the power control setting a cascode voltages as shown in FIG. 24 results in a wide power control range.

FIG. 25 illustrates exemplary control voltage curves achieved which can be used with the power control scheme. FIG. 25(a) shows a two segment piecewise linear characteristic having a single inflection point 250 at $V_{kink}$. The position of the "kink" point 250 needs to be aligned with the point when the output stage 240 will start to saturate. This can be achieved with a saturation detector 266 (see FIG. 26(*a*)) that provides a self-alignment between the power amplifier system control characteristic saturation point(s) $P_{out}(V_{ctrl})$ (see FIG. 26(*c*)) and the control curve $V_{ctrl}(V_{ramp})$ nonlinear control curve inflection (kink) point(s) (see FIG. 26(*b*)). The kink point 250 can be moved upper and lower but it is hard to control the slope of the characteristic after the output stage 240 has entered in strong saturation. This certainly limits the adjusting and tuning capability of the power control scheme.

However, ensuring the good efficiency at backed-off power requires the control of not only the output stage (gate 240 or drain 230) but also of the preceding driver(s) 246 or 231. Therefore, the power control loop output needs to generate multiple voltages and/or current signals. Using the multiple feedback structure as shown in FIG. 24 has the advantage of providing a wide range of tunability, as the different output quantities are set independent. Such a wide range tunability may be desired for the optimization of the power amplifier system 10 performance.

Other multiple feedback or hybrid feedback and feed-forward power control loops 100 can be provided, but they fall into the same case of power control disclosed herein.

Looking from the top-level perspective, the power amplifier system 10 signal path has multiple control knobs 246, 247, 248, 249. Some of them are current controls, such as the bias current of the last driver 246, or the bias current of the pre-driver. Others are voltage controls, such as the gate voltages (247, 248, 249) of the cascode output stage 240.

Although the power amplifier system 10 may have a single global power control loop it may have multiple control points realized in feedback fashion, or feedback and feed-forward fashion. This is a general way of implementing the linear summation V+I power control loop 100. The specific choice for the main control point (feedback) and the auxiliary control points (feedback or feed-forward) gives different power control curve shapes, but they fall into the same principal technique.

Because the power amplifier systems 10 of the present invention have such a vast design corner space, including process corners, temperature corners, supply voltage corners, frequency corners and a wide output power range, it is desirable to have substantial adjustability on the selected power control scheme. Although possible, the analog tuning is generally less robust due to its intrinsic variability. Particularly in the CMOS implementations, it is advantageous to use the mixed signal capabilities of the process. Performing the tuning using digital-to-analog (DAC) converters and having a unique and standardized digital I/O. (input output) control bus 279 (see FIG. 27) is a good choice. Because DACs can generate both voltages and currents, or alternatively modify resistors or capacitors, there are many ways to implement slope, offset and even time constant correction (adjustability) of the power control curves.

FIG. 27(*a*) illustrates an exemplary embodiment for the digital tuning of a drain power control loop. The main elements that can be adjusted using DAC are the voltage feedback ratio controlled by the R-DAC resister DACs 271, 272, 273; the current feedback ratio controlled by the I-DAC current DAC 274; the offset of the control curve set by the I-DAC current DAC 275. Other methods of implementing the adjustment DACs are possible.

With the implementation from FIG. 27 there may be a finite dependence between the voltage and current control feedback ratio. A proper selection of the values for the DAC resistances in the feedback network can minimize such undesired dependencies. More complicated feedback networks can be used in order to reduce the dependence between the voltage and current weighting coefficients. A similar DAC control architecture can be implemented in the case when a current-mode signal processing is used.

FIG. 37(*b*) illustrates a DAC tuning architecture applied to the gate power control scheme. A variety of voltage (V-DAC), current and (I-DAC) and/or resistor (R-DAC) digital to analog converters 277, 278, 279 can be used to implement the needed adjustability.

An offset can be directly added by and I-DAC 2700. The individual VG1, VG2, VG3 voltages may have their slope and offset set with corresponding DAC's. All of these DACs offer significant tunability of the control curves as long as the output stage 270 is still operating in the linear regime. Once the output stage 270 gets into the hard-saturated regime, the control loop 100 overwhelms most of these adjustability terms and drive the control curves towards a single curve. Adding the DAC adjustments to the drain and gate power control schemes as shown in FIG. 27(*a*) (*b*) is very valuable for optimizing the design post fabrication.

Fully Incorporated by reference is patent U.S. Ser. No. 61/246,680, U.S. Ser. No. 61/246,760, U.S. Ser. No. 61/246,744, and U.S. Ser. No. 61/246,762, all filed on Sep. 29, 2009, directed to systems and methods for adaptively optimizing power amplifier system linearity and other performance metrics, including but not limited to, power, efficiency, gain flatness, gain and the like, with variations in environmental conditions, such as VBAT, Process, Temperature, Frequency of operation, power input and the like.

FIG. 28 shows an exemplary embodiment where a power control loop 283 using sensed voltage and current summation is used; control curves 284 having inflection points or a continuous nonlinear characteristic are used in the power control block; DC-DC converters 287 are used to provide bias voltages for the signal path stages; adjustable output stage biasing is used to improve the power amplifier linearity 285 (e.g. reduce the AM-to-PM distortion by modulating the power amplifier nonlinear output capacitance); a hybrid low-voltage and high-voltage transistors cascade architecture is used in the output stage 280; the power amplifier signal path has protection stages 286 that prevent breakdown issues.

The performance enhancement techniques can be used in both linear power amplifier applications (a) and nonlinear (saturated) power amplifier applications (b) as shown in FIG. 29.

The power amplifier system can use only one or a selection of the presented performance enhancement techniques from the slew of methods presented in this patent and the cross-referenced patents U.S. Ser. No. 61/246,680, U.S. Ser. No. 61/246,760, U.S. Ser. No. 61/246,744, and U.S. Ser. No. 61/246,762, all filed on Sep. 29, 2009.

Expected variations or differences in the results are contemplated in accordance with the objects and practices of the present invention. It is intended, therefore, that the invention be defined by the scope of the claims which follow and that such claims be interpreted as broadly as is reasonable.

What is claimed is:

1. A power amplifier system, comprising:
   a main signal path;
   one or more power control ports;
   a baseband current sensor;
   a baseband voltage sensor
   a power control block driven by an output power estimator block based on at least one of, a linear and a higher order summation of a sensed output voltage and current signals from the baseband current and voltage sensors, the baseband current and voltage sensors providing baseband sensing when the voltage and current are already in their envelope form and summation without multiplication, the voltage and current sensors directly driving the output power estimator block.

2. The system of claim 1, wherein the power amplifier system is achieved using at a semiconductor processes selected from at least one of, CMOS, BCD, bipolar, BiCMOS, hetero-junction, compound, GaAs, GaN, SiGe and InP.

3. The system of claim 1, wherein a power control technique is used that is selected from at least one of, a drain power control, a gate power control and a combination of drain and gate power control.

4. The system of claim 1 using one of the following signal processing techniques: a voltage-mode, a current-mode, a hybrid voltage and current.

5. The system of claim 1, wherein the system is used for at least one of, a constant envelope application that is a resistor divider, reactive divider, or resistive-reactive divider, a modulated variable envelope application that is a linear power amplifier, a multi-mode application where the power amplifier operates in both linear and non-linear modes.

6. The system of claim 1 further comprising at least one of, an open-loop control, a closed-loop control, and a combination of open-loop and closed-loop control of an output power level.

7. The system of claim 1 wherein control block architectures is used selected from at least one of, a single control point in the signal path, multiple control points in a signal path, a single feedback quantity and multiple feed-forward quantities.

8. The system of claim 1 wherein the power control block uses at least one of, RF, baseband, a combination of RF and baseband signal sensing for the output voltage and current used by the power control block.

9. The system of claim 1 further comprising:
using digital-to-analog converters to provide at least one of, gain, offset, pedestal, threshold and other adjustability to different sections of a non-linear control curve.

10. The system of claim 1, further comprising using at least one of, a power control loop is used between signal paths of multiple bands, multiple modes of operation and a combination of multiple-bands and multiple modes.

11. The system of claim 1 further comprising, using multiple loops to control output power levels driven by one or more estimated power levels at different points in a power amplifier signal path.

12. The system of claim 1 further comprising, providing adjustability to a power amplifier control system using at least one of, digital-to-analog converters, analog controlled circuits for at least one of, feedback or feed-forward path currents, voltages, resistors and capacitors.

13. The system of claim 1, wherein in response to load conductance changes over a broad range voltage limiting or current limiting is changed.

14. The system of claim 1, wherein in response to increasing a feedback due to adding current feedback, a feedback network ratio is adjusted to restore a same nominal gain under a nominal load.

15. The system of claim 1, wherein an error amplifier is controlled by modifying a feedback.

16. The system of claim 1, wherein in response to a bad load an alert is provided.

* * * * *